(12) United States Patent
Yu et al.

(10) Patent No.: US 11,810,920 B2
(45) Date of Patent: Nov. 7, 2023

(54) INTEGRATED CIRCUITS INCLUDING INTEGRATED STANDARD CELL STRUCTURE

(71) Applicant: Samsung Electronics Co., Ltd., Suwon-si (KR)

(72) Inventors: Ji Su Yu, Seoul (KR); Jae-Ho Park, Suwon-si (KR); Sanghoon Baek, Seoul (KR); Hyeon Gyu You, Hwaseong-si (KR); Seung Young Lee, Seoul (KR); Seung Man Lim, Siheung-si (KR)

(73) Assignee: Samsung Electronics Co., Ltd.

( * ) Notice: Subject to any disclaimer, the term of this patent is extended or adjusted under 35 U.S.C. 154(b) by 351 days.

(21) Appl. No.: 17/027,211

(22) Filed: Sep. 21, 2020

(65) Prior Publication Data

US 2021/0167090 A1  Jun. 3, 2021

(30) Foreign Application Priority Data

Nov. 29, 2019 (KR) .......................... 10-2019-0156480
May 6, 2020 (KR) .......................... 10-2020-0053914

(51) Int. Cl.
*H01L 27/02* (2006.01)
*H01L 27/118* (2006.01)

(52) U.S. Cl.
CPC .... *H01L 27/11807* (2013.01); *H01L 27/0207* (2013.01); *H01L 2027/11861* (2013.01); *H01L 2027/11866* (2013.01); *H01L 2027/11885* (2013.01)

(58) Field of Classification Search
CPC ............ H01L 27/11807; H01L 23/528; H01L 27/0207; G06F 30/39; G06F 30/392; G11C 11/412
See application file for complete search history.

(56) References Cited

U.S. PATENT DOCUMENTS

| | | | |
|---|---|---|---|
| 9,734,276 B2 | 8/2017 | Kim et al. | |
| 9,768,111 B2 | 9/2017 | O'Brien et al. | |
| 10,248,752 B2 | 4/2019 | Won et al. | |
| 10,354,947 B2 | 7/2019 | Kim et al. | |
| 2017/0154848 A1 | 6/2017 | Fan et al. | |

(Continued)

FOREIGN PATENT DOCUMENTS

| | | |
|---|---|---|
| KR | 20170099338 | 8/2017 |
| KR | 20210041737 A | 4/2021 |

*Primary Examiner* — Mounir S Amer
*Assistant Examiner* — Alexander Belousov
(74) *Attorney, Agent, or Firm* — Myers Bigel, P.A.

(57) ABSTRACT

An integrated circuit includes a first standard cell including a first p-type transistor, a first n-type transistor, a first gate stack intersecting first and second active regions, first extended source/drain contacts on a first side of the first gate stack, a first normal source/drain contact on a second side of the first gate stack, a first gate via connected to the first gate stack, and a first source/drain via connected to the first normal source/drain contact, a second standard cell adjacent the first standard cell and including a second p-type transistor, a second n-type transistor, a second gate stack intersecting the first and second active regions, and a second gate via connected to the second gate stack, an input wiring connected to the first gate via, and an output wiring at a same level as the input wiring to connect the first source/drain via and the second gate via.

20 Claims, 20 Drawing Sheets

(56) References Cited

U.S. PATENT DOCUMENTS

| | | |
|---|---|---|
| 2018/0342468 A1 | 11/2018 | Rajendran et al. |
| 2018/0365368 A1 | 12/2018 | Do et al. |
| 2019/0287891 A1 | 9/2019 | Kim et al. |
| 2021/0057281 A1* | 2/2021 | Liaw ............... H01L 21/823487 |
| 2021/0098466 A1* | 4/2021 | Liaw ............... H01L 21/823878 |

* cited by examiner

INTEGRATED CIRCUITS INCLUDING INTEGRATED STANDARD CELL STRUCTURE

CROSS-REFERENCE TO RELATED APPLICATION

This application claims the benefit of Korean Patent Application No. 10-2019-0156480, filed on Nov. 29, 2019, and Korean Patent Application No. 10-2020-0053914, filed on May 6, 2020, in the Korean Intellectual Property Office, the entire disclosures of each of which are incorporated herein by reference.

BACKGROUND

1. Field

The present disclosure relates to integrated circuits including an integrated standard cell structure.

2. Description of the Related Art

As the electronics industry is highly developed, the demand for characteristics of integrated circuits included in semiconductor devices is increasing. For example, there is an increasing demand for high reliability, high speed and/or multi-functionality for semiconductor devices. To meet these requirements, structures in integrated circuits are becoming increasingly complicated and highly integrated.

An integrated circuit may be designed based on standard cells. Specifically, a layout of an integrated circuit may be generated by placing standard cells according to data that defines the integrated circuit and routing the placed standard cells. Such standard cells may be predesigned and stored in a cell library.

SUMMARY

Aspects of the present disclosure provide integrated circuits which reduce a power loss and/or a placement and routing (PnR) resource loss by reducing the use of upper wiring.

Aspects of the present disclosure also provide integrated circuits that can increase layout density and/or improve the performance and reliability of a designed semiconductor device by reducing the use of upper wiring.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

According to an aspect of the present disclosure, an integrated circuit includes a first standard cell and a second standard cell. The first standard cell includes a first p-type transistor, a first n-type transistor, a first gate stack that extends in a second direction to intersect a first active region and a second active region that extends in a first direction, at least two first extended source/drain contacts that extend in the second direction on a first side of the first gate stack, a first normal source/drain contact that extends in the second direction on a second side of the first gate stack that is opposite the first side, a first gate via that is connected to the first gate stack, and a first source/drain via that is connected to the first normal source/drain contact. The second standard cell is adjacent to the first standard cell in the first direction and includes a second p-type transistor, a second n-type transistor, a second gate stack that extends in the second direction to intersect the first active region and the second active region, and a second gate via that is connected to the second gate stack. The integrated circuit also includes an input wiring of the first standard cell that extends in the first direction and is connected to the first gate via and an output wiring of the first standard cell that extends in the first direction and is at a same level as the input wiring to connect the first source/drain via and the second gate via. The first p-type transistor and the second p-type transistor are on the first active region. The first n-type transistor and the second n-type transistor are on the second active region.

According to another aspect of the present disclosure, an integrated circuit includes first, second, third, and fourth active regions that extend in a first direction on a substrate and are spaced apart from each other in a second direction, an active region separation layer that extends in the first direction on the substrate and is between ones of the first through fourth active regions, a first standard cell that comprises a first p-type transistor, a first n-type transistor, a second p-type transistor, and a second n-type transistor, a second standard cell that has a side adjacent to the first standard cell in the first direction and comprises a third p-type transistor and a third n-type transistor and a first output wiring that extends in the first direction and connects a first source/drain via and a second gate via, wherein the first p-type transistor and the third p-type transistor are on the first active region, the first n-type transistor and the third n-type transistor are on the second active region, the second p-type transistor is on the third active region, and the second n-type transistor is on the fourth active region. The first standard cell includes at least one first gate stack that extends in the second direction to intersect the first through fourth active regions, at least one first extended source/drain contact that extends in the second direction and is on a first side of the first gate stack in each of the first through fourth active regions, at least one first normal source/drain contact the extends in the second direction and is on a second side of the first gate stack to intersect the first through fourth active regions and the first source/drain via that is connected to the first normal source/drain contact. The second standard cell includes at least one second gate stack that extends in the second direction to intersect the first and second active regions and the second gate via that is connected to the second gate stack. The first output wiring is at a same level as at least one power wiring of each of the first standard cell and the second standard cell in a third direction.

According to other aspect of the present disclosure, an integrated circuit includes a plurality of standard cells that are adjacent to each other and a first connection wiring, wherein each of the standard cells includes at least two active regions that extend in a first direction, at least one active region separation layer that extends in the first direction and is between the at least two active regions, a gate stack that extends in a second direction to intersect the at least two active regions and the active region separation layer, a gate via that is stacked on the gate stack in a third direction and is connected to the gate stack, at least one extended source/drain contact which extends in the second direction on a first side of the gate stack, a normal source/drain contact that extends in the second direction on a second side of the gate stack opposite the first side, a plurality of extended source/drain vias that are stacked on the extended source/drain contact in the third direction and are connected to the extended source/drain contact, and a normal source/drain via that is stacked on the normal source/drain contact in the third direction and is connected to the normal source/drain contact. The normal source/drain contact comprises an output terminal of each standard cell, and the first connection wiring extends in the first direction, is connected to the normal source/drain via of a first standard cell, and is further connected to the gate via of a second adjacent standard cell.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
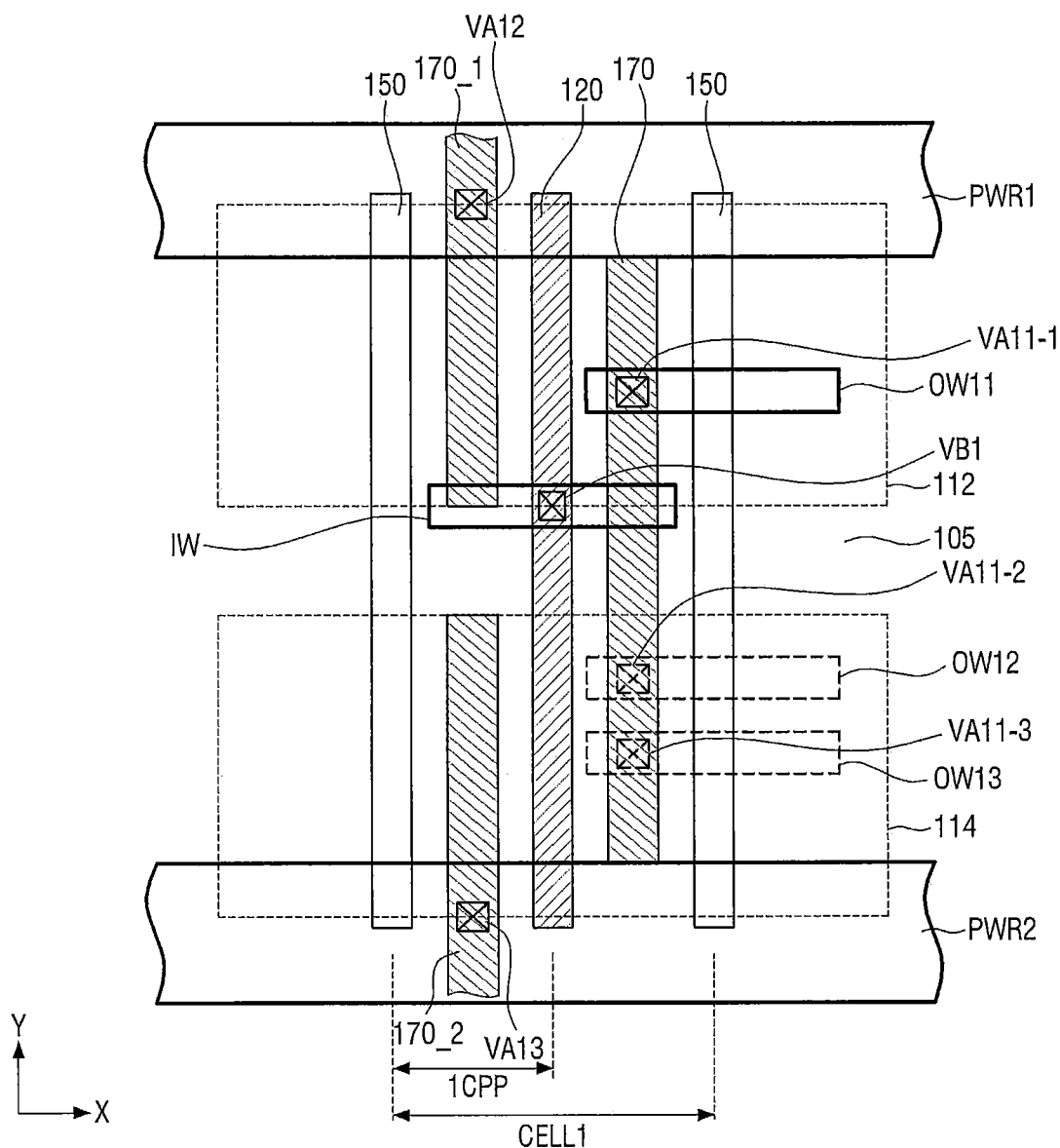
FIG. 1 is a layout view of an integrated circuit according to example embodiments of the present disclosure.

In the following description, integrated circuits of various example embodiments are provided on a substrate 100 (see FIG. 3), for example, a semiconductor substrate. An integrated circuit has a layout including various standard cells. The standard cells are integrated circuit structures predesigned for repeated use in individual integrated circuit designs. Effective integrated circuit design layouts may include various predesigned standard cells and predefined rules for placing the standard cells to improve circuit performance and reduce circuit area.

An integrated circuit according to example embodiments includes one or more standard cells placed in an integrated circuit layout according to predefined rules. The standard cells are repeatedly used in integrated circuit design. Therefore, the standard cells may be predesigned according to manufacturing technology and stored in a standard cell library. An integrated circuit designer may search for such standard cells and include the standard cells in an integrated circuit design and may place the standard cells in an integrated circuit layout according to predefined placement rules.

A standard cell may include various basic circuit devices such as an inverter, AND, NAND, OR, XOR and NOR frequently used in digital circuit designs for electronic devices such as central processing unit (CPU), graphics processing unit (GPU), and system-on-chip (SOC) designs. The standard cell may also include other things frequently used in a circuit block, such as a flip-flop and a latch.

A filler cell may be a designed block of an integrated circuit which is inserted between two adjacent standard cells to conform to integrated circuit design and integrated circuit manufacturing rules. The proper design and arrangement of standard cells and filler cells may improve packing density and circuit performance.

In the drawings relating to integrated circuits according to embodiments, a fin field effect transistor (FinFET) including a fin pattern-shaped channel region is illustrated. However, the embodiments of the present disclosure are not limited thereto. For example, an integrated circuit according to embodiments may include a tunneling FET, a transistor including a nanowire, a transistor including a nanosheet, and/or a three-dimensional (3D) transistor. In addition, an integrated circuit according to embodiments of the present disclosure may include a bipolar junction transistor, a lateral double diffused metal oxide semiconductor transistor (LDMOS), or the like.

FIGS. 1 through 11B illustrate an integrated circuit according to example embodiments of the present disclosure.

FIG. 1 is a layout view of an integrated circuit according to example embodiments. For reference, FIG. 1 may be a layout of a standard cell according to embodiments provided in a cell library.

Referring to FIG. 1, the integrated circuit according to the embodiments includes at least one cell CELL1.

In some embodiments, each cell may be separated from other cells by at least two insulating gates 150. The insulating gates 150 may extend in a second direction Y intersecting a first direction X to separate adjacent cells from each other.

The integrated circuit according to the embodiments includes a first active region 112, a second active region 114, an active region separation layer 105 between the first active region 112 and the second active region 114, at least one gate stack 120, at least one gate via VB1, a plurality of source/drain contacts 170, 170-1, and 170-2, a plurality of source/drain vias VA11-1, VA11-2, VA11-3, VA12, and VA13, a first power wiring PWR1, a second power wiring PWR2, and a plurality of wiring patterns IW, OW11, OW12, and OW13.

Figure 2:
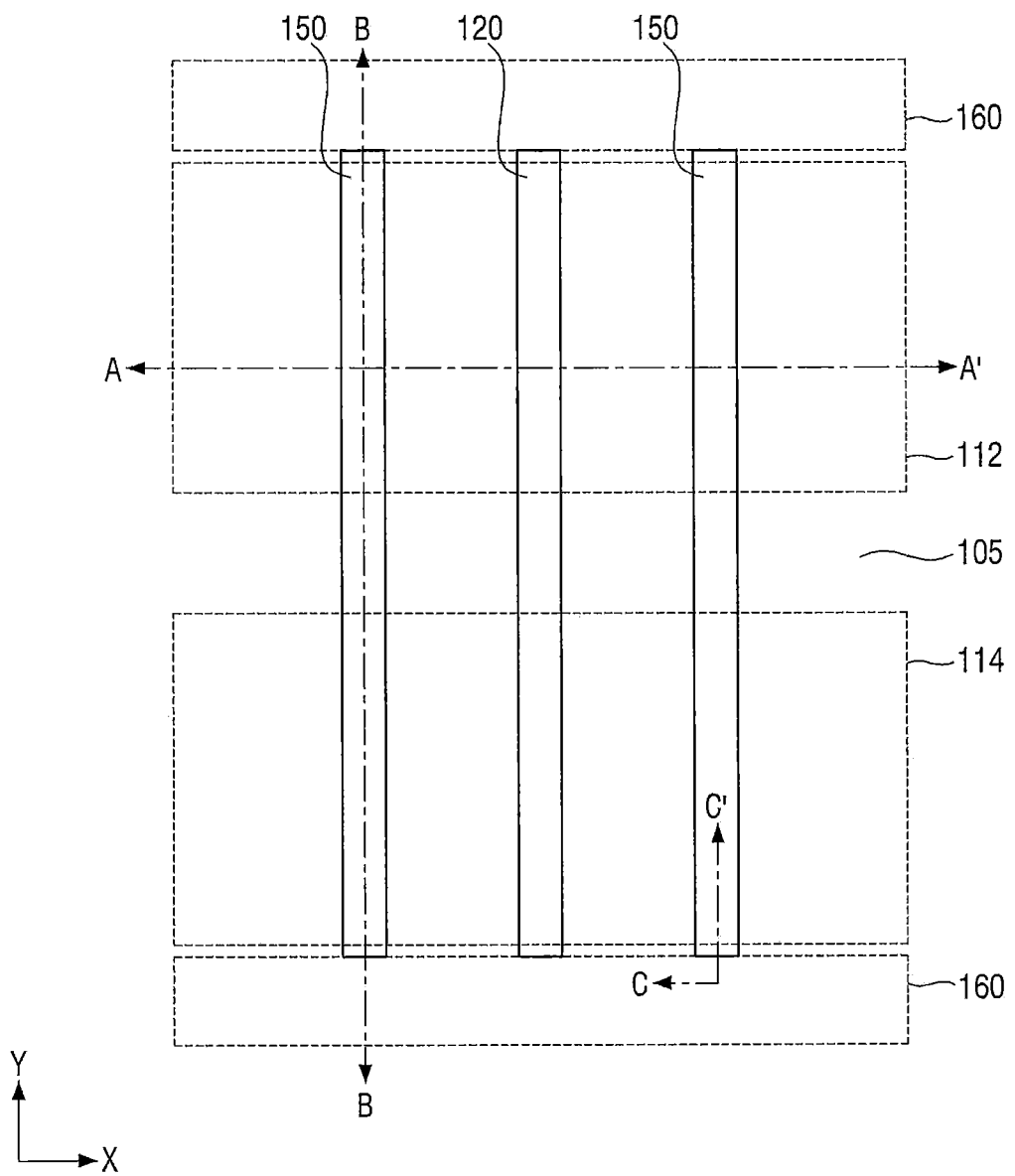
FIG. 2 is a top view of the integrated circuit according to example embodiments shown up to front-end-of-line (FEOL)
Figure 3:
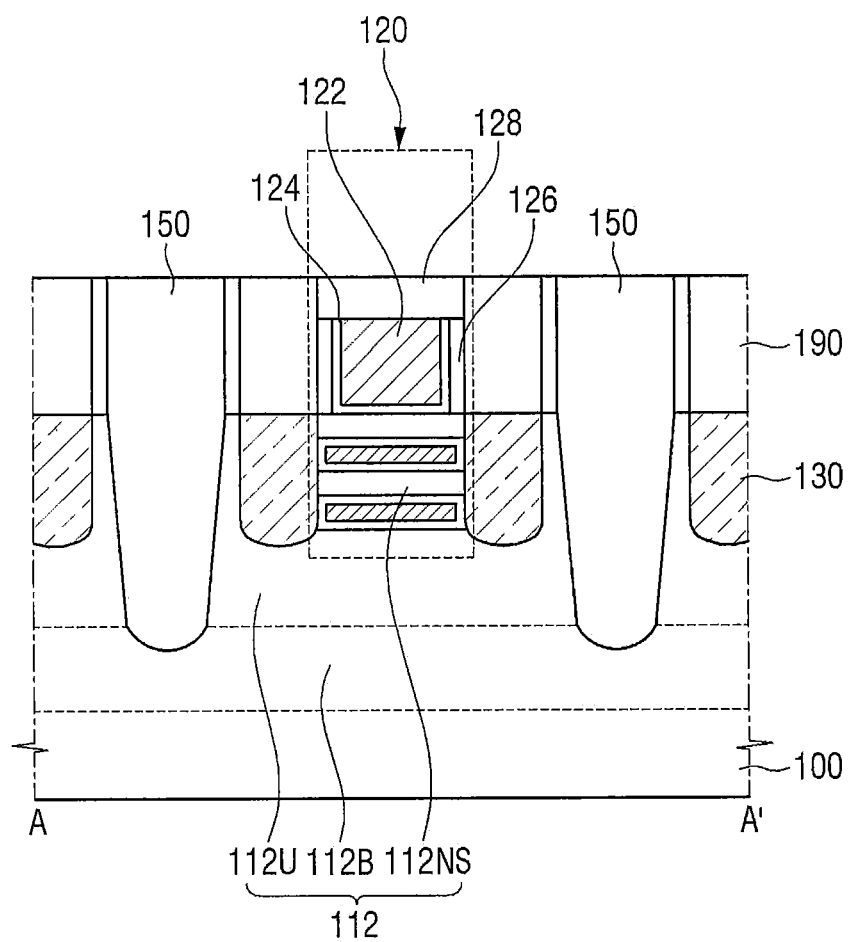
FIG. 3 is a cross-sectional view taken along line A-A' of FIG. 2.
Figure 4:
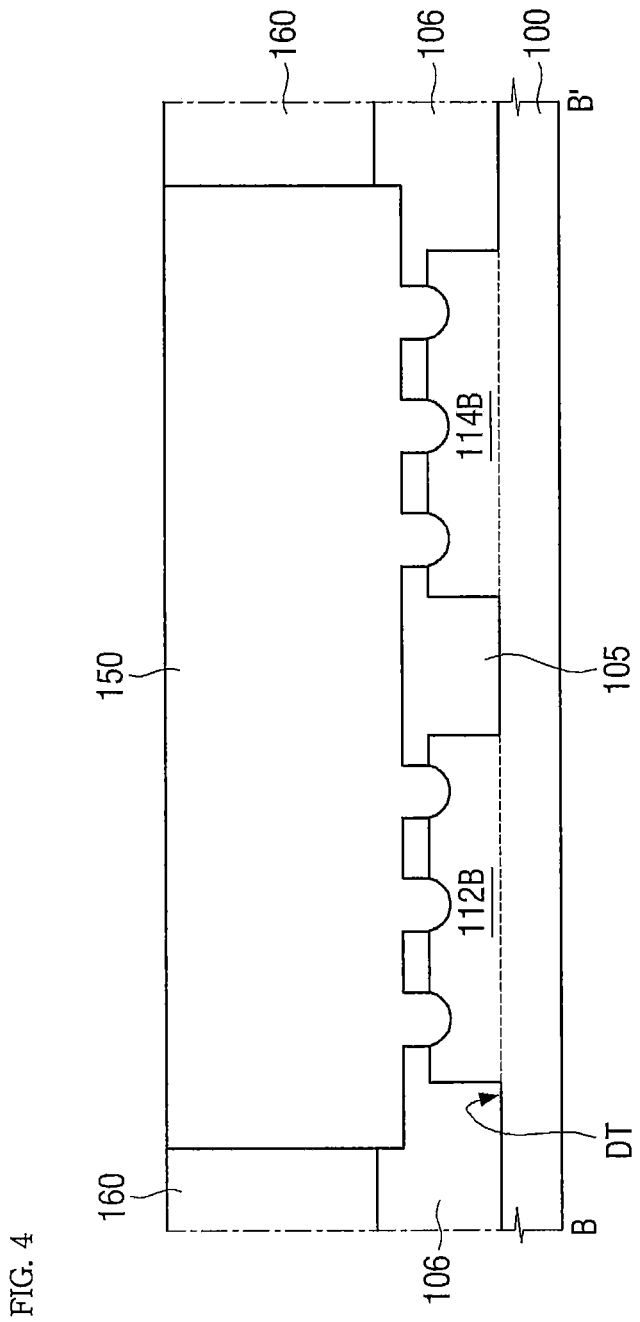
FIG. 4 is a cross-sectional view taken along line B-B' of FIG. 2.
Figure 5A:
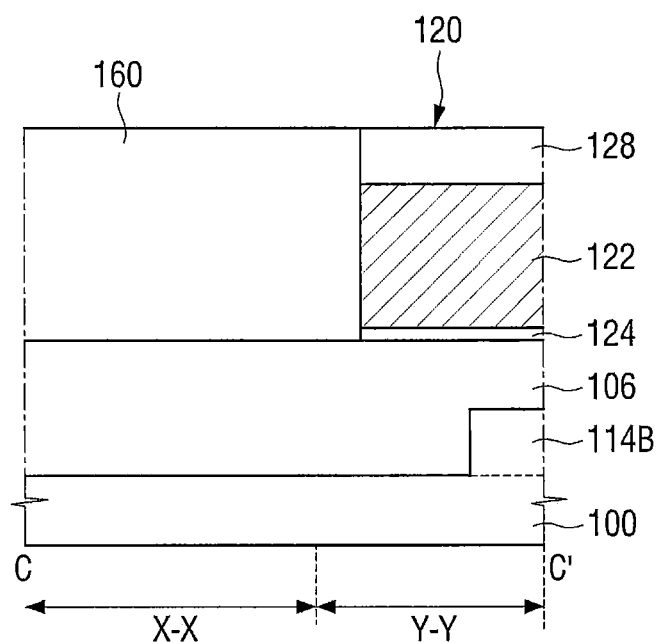
FIGS. 5A and 5B are each a cross-sectional view taken along line C-C' of FIG. 2.
Figure 5B:
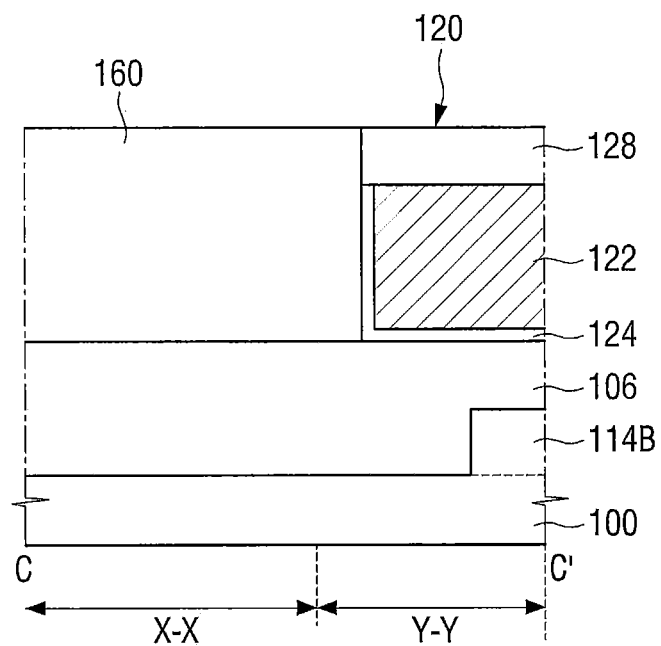

FIG. 2 is a top view of the integrated circuit according to the embodiments shown up to front-end-of-line (FEOL). FIG. 3 is a cross-sectional view taken along line A-A' of FIG. 2. FIG. 4 is a cross-sectional view taken along line B-B' of FIG. 2. FIGS. 5A and 5B are each a cross-sectional view taken along line C-C' of FIG. 2.

Figure 6:
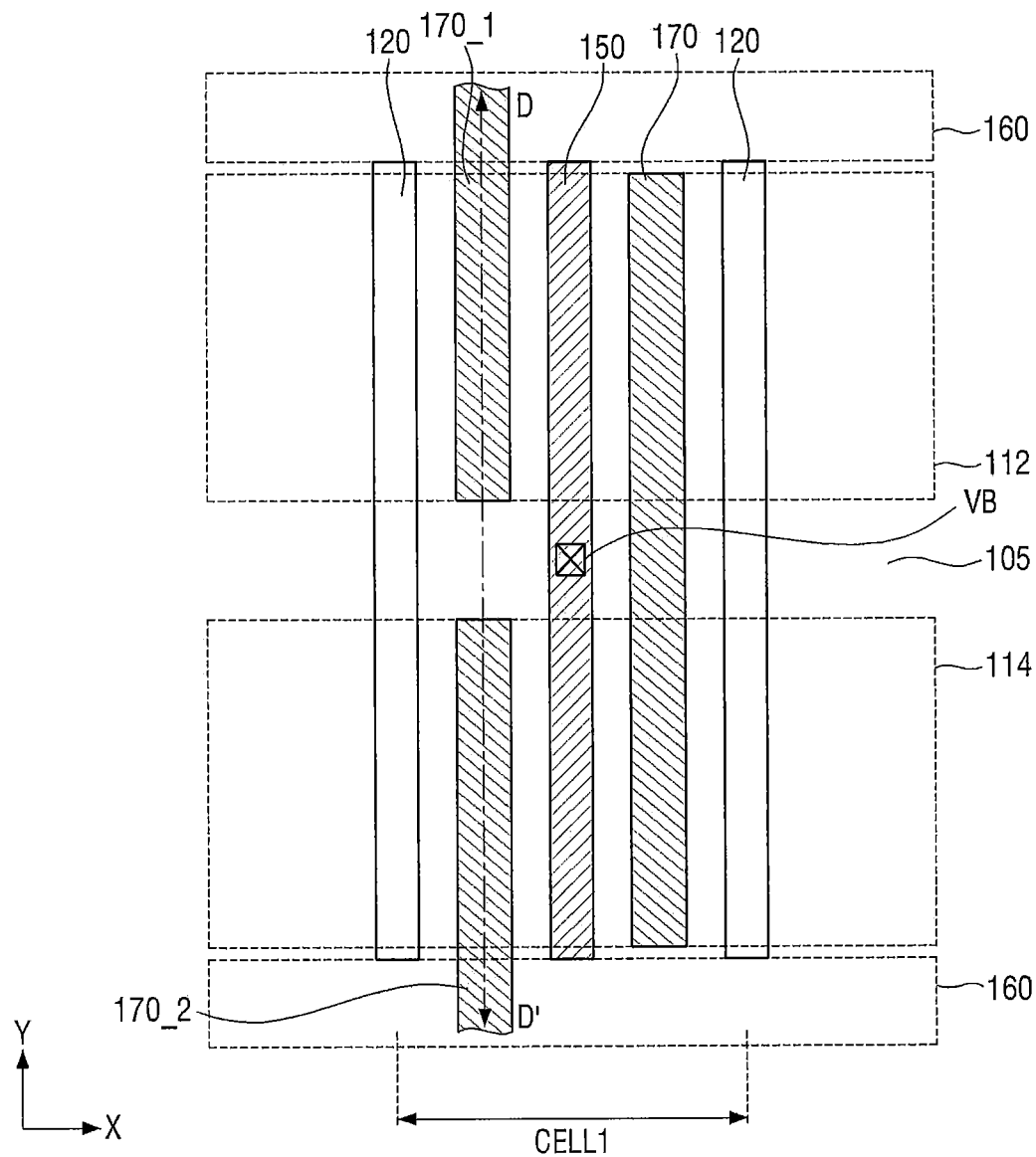
FIG. 6 is a top view of the integrated circuit according to example embodiments shown up to middle-of-line (MOL)

FIG. 6 is a top view of the integrated circuit according to the embodiments shown up to middle-of-line (MOL). FIGS.

Figure 8A:
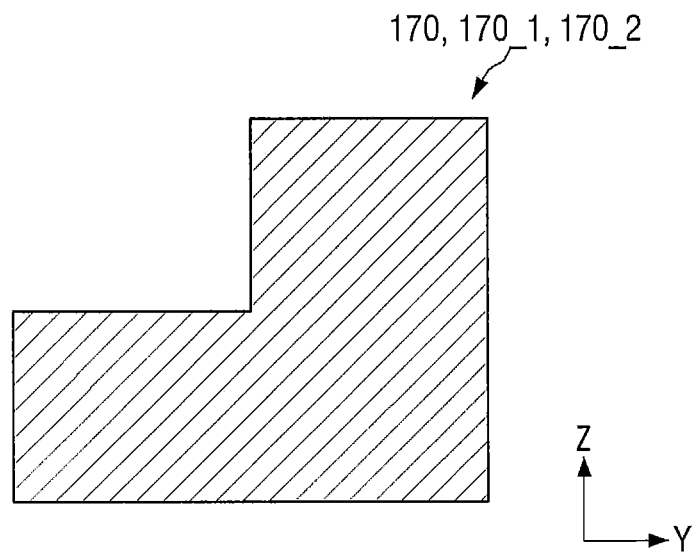
FIGS. 8A and 8B are various views of the source/drain contact of FIG. 6, cut along the second direction Y.
Figure 8B:
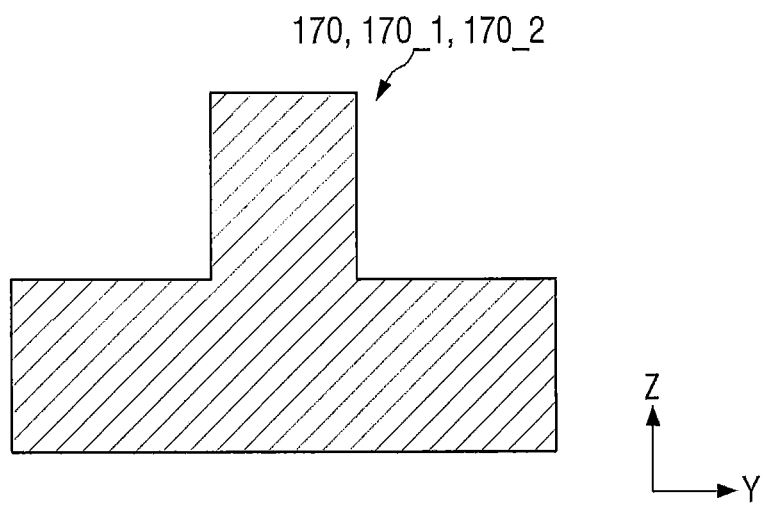

7A and 7B are each a cross-sectional view taken along line D-D' of FIG. 6. FIGS. 8A and 8B are various views of the source/drain contact 170 or 170_1 of FIG. 6, cut along the second direction Y.

Figure 9:
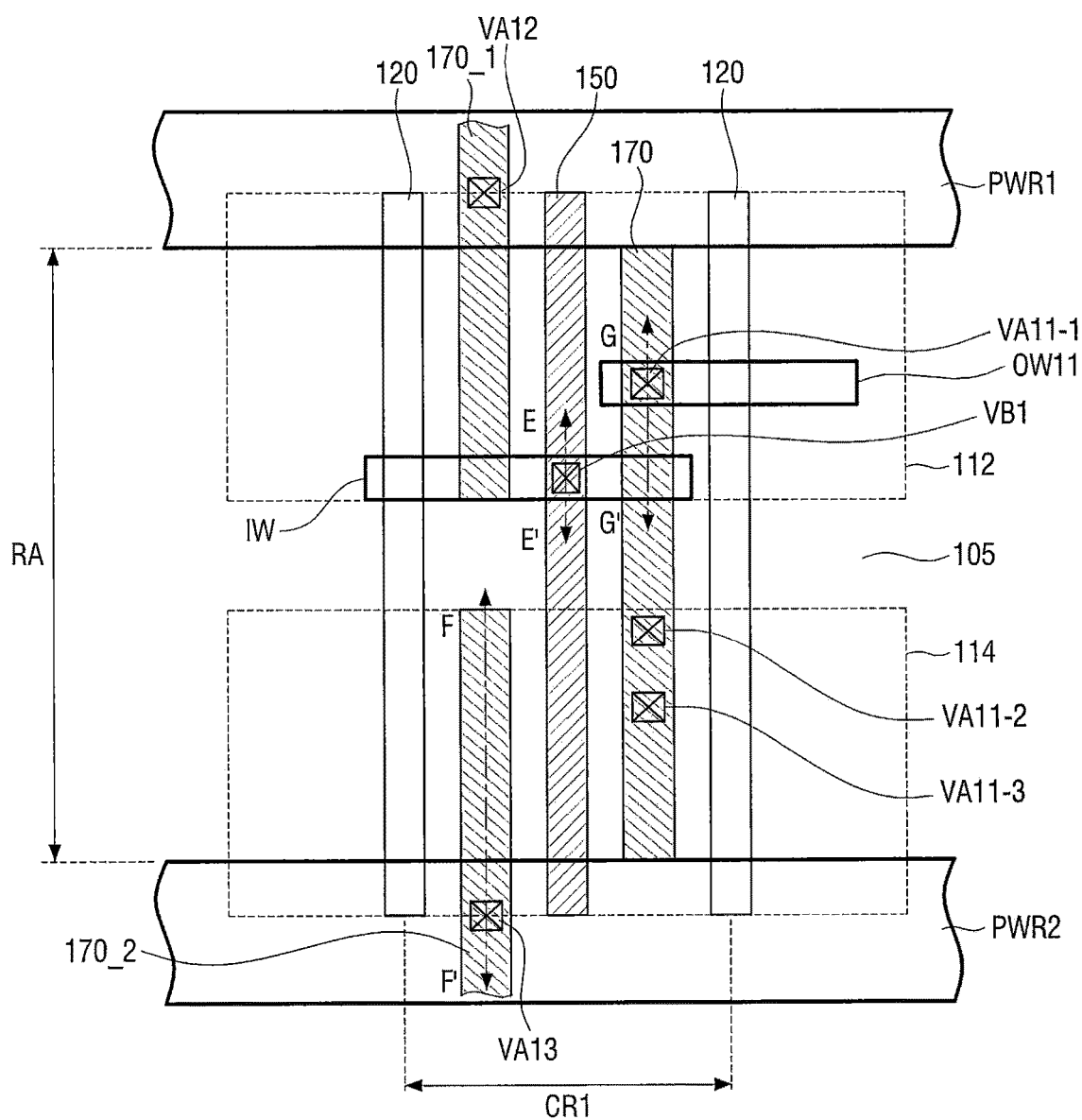
FIG. 9 is a view of a wiring layer formed on the top view of FIG. 6.

For reference, in FIGS. 5A and 5B, X-X and Y-Y indicate cut directions. FIG. 9 is a view of a wiring layer formed on the top view of FIG. 6. In addition, FIG. 9 illustrates vias connected to a gate contact and source/drain contacts and an M1 metal layer disposed on the vias.

Referring to FIGS. 1 through 11B, the integrated circuit according to the embodiments may include at least one standard cell CELL1.

The standard cell CELL1 may be formed on a substrate 100. The substrate 100 may be a silicon substrate or a silicon-on-insulator (SOI) substrate. In some embodiments, the substrate 100 may include, but not limited to, silicon germanium, silicon germanium on insulator (SGOI), indium antimonide, lead telluride, indium arsenide, indium phosphide, gallium arsenide, or gallium antimonide.

The first active region 112 may be defined along the first direction X. The first active region 112 may be defined by a deep trench DT. The first active region 112 may be a region in which a p-type transistor is formed. The first active region 112 may include a well region doped with, e.g., n-type impurities.

The first active region 112 may include a first lower active region 112B, a first upper active region 112U, and first nanosheets 112NS. Sidewalls of the first lower active region 112B may be defined by the deep trench DT. The first upper active region 112U may have a fin shape protruding from the first lower active region 112B. Sidewalls of the first upper active region 112U may be defined by a trench shallower than the deep trench DT. The first nanosheets 112NS may be spaced apart from the first upper active region 112U. Although two first nanosheets 112NS are illustrated in the drawings, this is merely an example used for ease of description, and the present disclosure is not limited to this example.

The second active region 114 may be defined along the first direction X. The second active region 114 may be defined at a distance from the first active region 112 in the second direction Y. The first active region 112 and the second active region 114 may be separated by the deep trench DT. The second active region 114 may be a region in which an n-type transistor is formed. The second active region 114 may include a well region doped with, e.g., p-type impurities.

The second active region 114 may include a second lower active region 114B, a second upper active region 114U, and second nanosheets that are configured similarly to the first active region 112. Sidewalls of the second lower active region 114B may be defined by the deep trench DT. The second upper active region 114U may have a fin shape protruding from the second lower active region 114B. Sidewalls of the second upper active region 114U may be defined by a trench shallower than the deep trench DT. As with the first active region 112, the second nanosheets of the second active region 114 may be spaced apart from the second upper active region 114U.

The standard cell CELL1 may include the first active region 112 and the second active region 114.

An active region separation layer 105 may be formed on the substrate 100. The active region separation layer 105 may cross between the first active region 112 and the second active region 114. The active region separation layer 105 may extend in the first direction X. The active region separation layer 105 may be within and/or fill the deep trench DT that separates the first active region 112 and the second active region 114.

A cell separation layer 106 may be formed on the substrate 100. The cell separation layer 106 may be within and/or fill a deep trench DT that is adjacent the first active region 112 and/or the second active region 114. The cell separation layer 106 may extend in the first direction X along a boundary of the standard cell CELL1. Each of the active region separation layer 105 and the cell separation layer 106 may include an insulating material.

The active region separation layer 105 and the cell separation layer 106 may include an insulating material that is within and/or fills the deep trench DT defining the first active region 112 and the second active region 114. In the following description, the active region separation layer 105 may be an insulating material layer disposed between the first active region 112 and the second active region 114 included in one cell. That is, the active region separation layer 105 will be described as an insulating material layer disposed inside a cell. The cell separation layer 106 may be an insulating material layer not disposed inside a cell but extending along a cell boundary extending in the first direction X among cell boundaries. That is, the cell separation layer 106 will be described as an insulating material layer disposed along a cell boundary.

The gate stack 120 and the insulating gates 150 disposed adjacent to each other in the first direction X according to embodiments may be spaced apart by 1 contacted poly pitch (1CPP). For example, adjacent gate stacks 120 may be spaced apart by 1 CPP. For another example, a gate stack 120 and an insulating gate 150 adjacent to each other may be spaced apart by 1 CPP. For another example, adjacent insulating gates 150 may be spaced apart by 1 CPP. In the present specification, a gap between a first gate and a second gate is referred to as a CPP. However, the scope of the present disclosure is not limited thereto, and the gap may also be referred to as another term such as a grid.

For example, assuming that there are a first gate stack and a second gate stack adjacent to each other, when a distance between a centerline of the first gate stack extending in the second direction Y and a centerline of the second gate stack extending in the second direction Y is 1 CPP, it means that another gate stack or insulating gate is not disposed between the first gate stack and the second gate stack.

The gate stack 120 and the insulating gates 150 may be disposed over the first active region 112 and the second active region 114. The gate stack 120 and the insulating gates 150 may extend from the first active region 112 to the second active region 114. The gate stack 120 and the insulating gates 150 may cross the active region separation layer 105. A part of the gate stack 120 and a part of each insulating gate 150 may extend on the cell separation layer 106.

The integrated circuit may include a plurality of gate stacks 120 and a plurality of insulating gates 150. The gate stacks 120 and the insulating gates 150 may extend along the second direction Y. The gate stacks 120 and the insulating gates 150 may be disposed adjacent to each other in the first direction X.

The gate stack 120 may include a gate electrode 122, a gate insulating layer 124, gate spacers 126, and a gate capping layer 128. In some cases, the gate stack 120 may not include the gate capping layer 128. The gate spacers 126 may define a gate trench in which the gate insulating layer 124 and the gate electrode 122 may be formed. The gate spacers 126 may include, for example, an insulating material. The gate insulating layer 124 may be formed along the perimeter of each first nanosheet 112NS. Although not illustrated, the gate insulating layer 124 may be formed along the perimeter of each second nanosheet of the second active region 114. The gate insulating layer 124 may include at least one of, e.g., silicon oxide and a high-k material. The high-k material may be a material having a higher dielectric constant than the silicon oxide. The gate electrode 122 may be formed on the gate insulating layer 124. The gate electrode 122 may cover the first nanosheets 112NS. Although not illustrated, the gate electrode 122 may cover the second nanosheets of the second active region 114. The gate electrode 122 may include at least one of, e.g., metal (including a metal alloy containing two or more metals), metal nitride, metal carbide, metal silicide, and/or a semiconductor material. The gate capping layer 128 may be disposed on the gate electrode 122. The gate capping layer 128 may include, for example, an insulating material.

The insulating gates 150 may divide at least a part of the first active region 112 and at least a part of the second active region 114. The insulating gates 150 may divide the first upper active region 112U of the first active region 112. Although the insulating gates 150 divide a part of the first lower active region 112B of the first active region 112 in the drawings, the present disclosure is not limited thereto. For electrical separation between adjacent devices, the insulating gates 150 may also divide the whole of the first lower active region 112B. Although not illustrated, the insulating gates 150 may divide the second upper active region 114U of the second active region 114 and divide a part of the second lower active region 114B. As for a manufacturing process for forming the insulating gates 150, at least a part of the first active region 112 and at least a part of the second active region 114 are removed, and then the removed parts of the first active region 112 and the second active region 114 are filled with an insulating material. Accordingly, the insulating gates 150 may be formed. Therefore, part of sidewalls of each insulating gate 150 may contact the first active region 112 and the second active region 114. Part of the sidewalls of each insulating gate 150 may contact a semiconductor material layer included in the first active region 112 and the second active region 114.

The insulating gates 150 may cross the active region separation layer 105. The insulating gates 150 may be disposed on the active region separation layer 105. A part of each insulating gate 150 may be recessed into the active region separation layer 105. In the process of forming the insulating gates 150, a part of the active region separation layer 105 may be removed. Therefore, a part of each insulating gate 150 may be recessed into the active region separation layer 105. The gate spacers 126 may be disposed on the sidewalls of each insulating gate 150. The insulating gates 150 may include, for example, an insulating material. Although each insulating gate 150 is illustrated as a single layer, the present disclosure is not limited thereto.

In the integrated circuit according to the embodiments, at least a part of each insulating gate 150 may be disposed at a boundary of the standard cell CELL1 extending in the second direction Y to separate adjacent standard cells. Each insulating gate 150 may be disposed not only at the boundary of the standard cell but also inside the standard cell. However, each insulating gate 150 will be described below as being disposed at the boundary of the standard cell extending in the second direction Y.

Figure 7A:
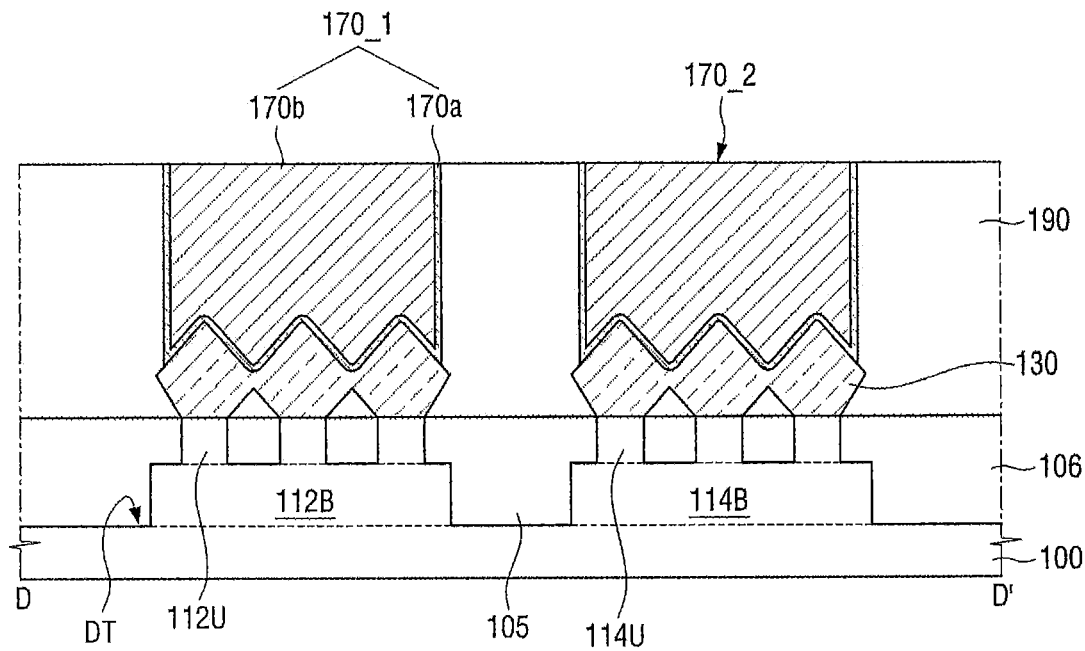
FIGS. 7A through 7B are each a cross-sectional view taken along line D-D' of FIG. 6.
Figure 7B:
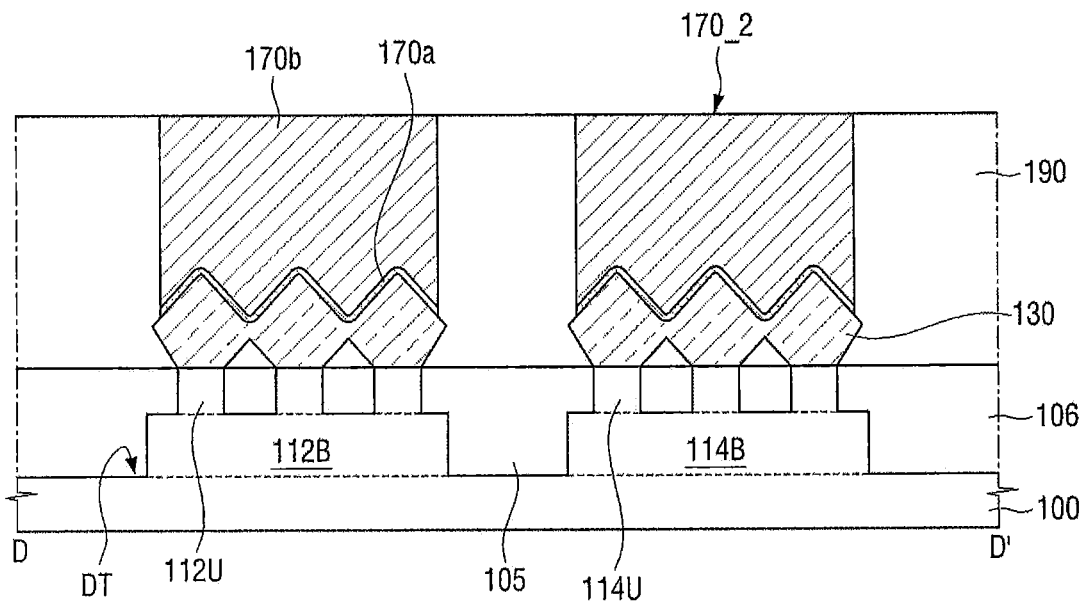

In FIGS. 7A and 7B, a semiconductor pattern 130 may be formed between the gate stack 120 and an insulating gate 150 adjacent to each other. The semiconductor pattern 130 may be formed by removing a part of an active region 112 or 114 to form a recess and then filling the recess through an epitaxial process.

The semiconductor pattern 130 may be formed on the first active region 112. The semiconductor pattern 130 may be formed on the second active region 114. At least a part of the semiconductor pattern 130 may be included in a source/drain region of a transistor. The semiconductor pattern 130 formed on the first active region 112 may be doped with impurities of a conductivity type different from that of impurities used to dope the semiconductor pattern 130 formed on the second active region 114. The semiconductor pattern 130 may also be formed between adjacent insulating gates 150.

Cell gate cutting patterns 160 may be disposed on the cell separation layer 106. The cell gate cutting patterns 160 may extend in the first direction X. The cell gate cutting patterns 160 may extend in the first direction X along the boundaries of the standard cell CELL1. The gate stack 120 and the insulating gates 150 may be disposed between the cell gate cutting patterns 160 spaced apart in the second direction Y. The cell gate cutting patterns 160 may include, for example, an insulating material.

The cell gate cutting patterns 160 may cut the gate stack 120 and/or the insulating gates 150 at cell boundaries. The cell gate cutting patterns 160 may contact the gate stack 120 and/or the insulating gates 150. The cell gate cutting patterns 160 may contact short sides of the gate stack 120 extending in the first direction X and short sides of the insulating gates 150 extending in the first direction X. The standard cell CELL1 may further include the cell gate cutting patterns 160 formed along its boundaries extending in the first direction X.

In FIG. 5A, the gate insulating layer 124 may not be formed on a sidewall of a cell gate cutting pattern 160. In FIG. 5B, the gate insulating layer 124 may extend along the sidewall of the cell gate cutting pattern 160. This difference may be based on at what stage the cell gate cutting pattern 160 is formed. When the cell gate cutting pattern 160 is formed after the gate electrode 122 is formed, the gate insulating layer 124 may not be formed on the sidewall of the cell gate cutting pattern 160 as illustrated in FIG. 5A. On the other hand, when the cell gate cutting pattern 160 is formed before the gate electrode 122 is formed (in a mold gate stage for forming the gate electrode 122), the gate insulating layer 124 may extend along the sidewall of the cell gate cutting pattern 160 as illustrated in FIG. 5B.

The standard cell CELL1 may share the insulating gates 150 with adjacent cells at common boundaries with the adjacent cells. Although the standard cell CELL1 is illustrated in FIGS. 1 through 10C as having a width of 2 CPP for ease of description, it may have a width of at least 1 CPP according to various embodiments.

The standard cell CELL1 may further include the first active region 112 and the second active region 114. The gate stack 120 included in the standard cell CELL1 may intersect the first active region 112 and the second active region 114. The standard cell CELL1 may include a first p-type transistor and a first n-type transistor. The p-type transistor may be formed at an intersection of the gate stack 120 and the first active region 112, and the n-type transistor may be formed at an intersection of the gate stack 120 and the second active region 114. For example, the p-type transistor may include the gate electrode 122, the first nanosheets 112NS which are a channel region, and the semiconductor patterns 130 which are source/drain regions.

The integrated circuit according to the embodiments may include the source/drain contacts 170, 170_1, and 170_2 and a gate contact 175.

The source/drain contacts 170, 170_1, and 170_2 may be disposed on the first active region 112 and the second active region 114. The source/drain contacts 170, 170_1, and 170_2 may be connected to the semiconductor patterns 130 formed on the first active region 112 and the second active region 114. The source/drain contacts 170, 170_1, and 170_2 may include a normal source/drain contact 170 and extended source/drain contacts 170_1 and 170_2. The normal source/drain contact 170 may entirely overlap the first active region 112 and/or the second active region 114. A part of each of the source/drain contacts 170_1 and 170_2 may extend on the cell separation layer 106 and a cell gate cutting pattern 160. The extended source/drain contacts 170_1 and 170_2 may be connected to the power wirings PWR1 and PWR2 (see FIG. 9) to be described later. In some embodiments, the extended source/drain contacts 170_1 and 170_2 may be discontinuously formed. For example, in some embodiments, the extended source/drain contacts 170_1 and 170_1 may be substantially collinear.

The gate contact 175 (see FIGS. 10A and 10B) may be formed on the gate stack 120 and is not formed on the insulating gates 150. The gate contact 175 may be connected to the gate stack 120. For example, the gate contact 175 may be electrically connected to the gate electrode 122 of the gate stack 120.

According to embodiments, the gate contact 175 may be disposed on the first active region 112 and the second active region 114. In addition, according to embodiments, the gate contact 175 may be formed on the active region separation layer 105. In the integrated circuit according to the embodiments, at least one of the gate contacts 175 may be disposed at a position overlapping one of the first active region 112 and the second active region 114.

The standard cell CELL1 may further include at least one normal source/drain contact 170, the extended source/drain contacts 170_1 and 170_2, and the gate contact 175.

In FIG. 7A, the source/drain contact 170_2 may include a contact barrier layer 170a and a contact filling layer 170b. The contact filling layer 170b may be within and/or fill a trench defined by the contact barrier layer 170a. On the other hand, in FIG. 7B, the contact barrier layer 170a may be formed only between the semiconductor pattern 130 and the contact filling layer 170b and may not be formed between an interlayer insulating film 190 and the contact filling layer 170b. In the subsequent drawings, the contact barrier layer 170a and the contact filling layer 170b are illustrated as a single layer instead of separate layers, but the present disclosure is not limited thereto.

FIGS. 8A and 8B illustrate example cross-sections of a source/drain contact 170, 170_1, or 170_2. FIGS. 8A and 8B are examples of cross-sectional views of the source/drain contact 170, 170_1, or 170_2 taken along the second direction Y.

Since the gate contact 175 is disposed on the first active region 112 and the second active region 114, a short margin between the gate contact 175 and each of the source/drain contacts 170, 170_1, and 170_2 may be taken into consideration. That is, depending on whether the gate contact 175 is located around the source/drain contacts 170, 170_1, and/or 170_2, the cross-sections of the source/drain contacts 170, 170_1, and/or 170_2 may have an L shape (see FIG. 8A) or a T shape rotated 180 degrees (see FIG. 8B). When the gate contact 175 is not disposed around the source/drain contacts 170, 170_1, and/or 170_2, the source/drain contacts 170, 170_1, and/or 170_2 may have cross-sections as illustrated in FIGS. 7A and 7B.

In FIGS. 9 through 11B, the integrated circuit according to the embodiments may include source/drain vias VA (e.g., VA11-1, VA11-2, VA11-3, VA12, and VA13), the gate via VB1, wiring patterns IW and OW (e.g., OW11), and the power wirings PWR1 and PWR2.

In the present specification, although all source/drain vias are referred to as the source/drain vias VA for ease of description, a source/drain via connected to a normal source/drain contact may also be referred to as a normal source/drain via, and a source/drain via connecting an extended source/drain contact and a power wiring may also be referred to as an extended source/drain via. The standard cell CELL1 may include the source/drain vias VA, the gate via VB1, the wiring patterns IW and OW11, and the power wirings PWR1 and PWR2.

Figure 10A:
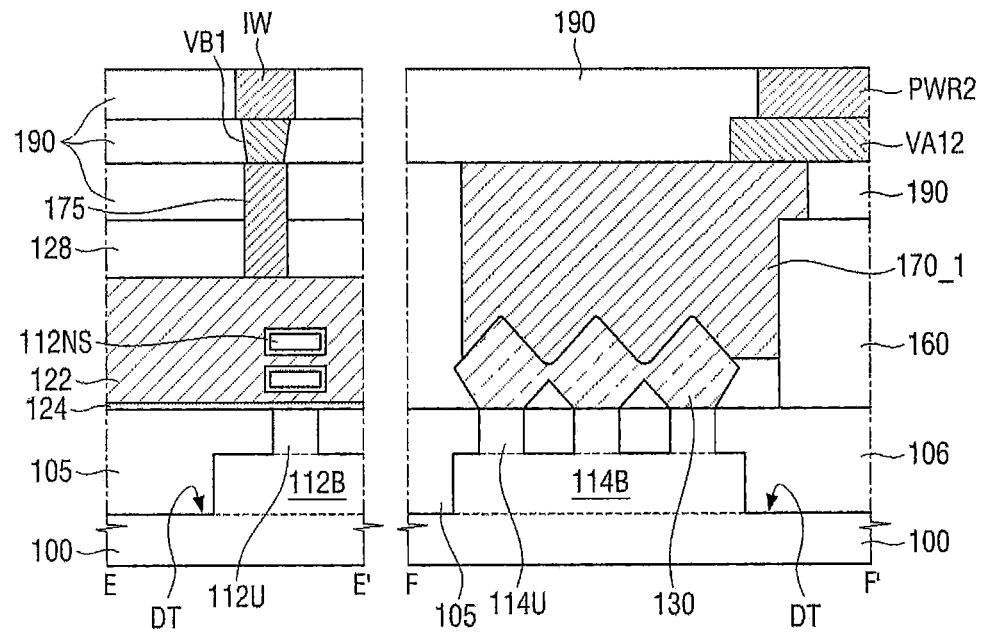
FIG. 10A through 10C are cross-sectional views taken along lines E-E' and F-F' of FIG. 9.
Figure 11A:
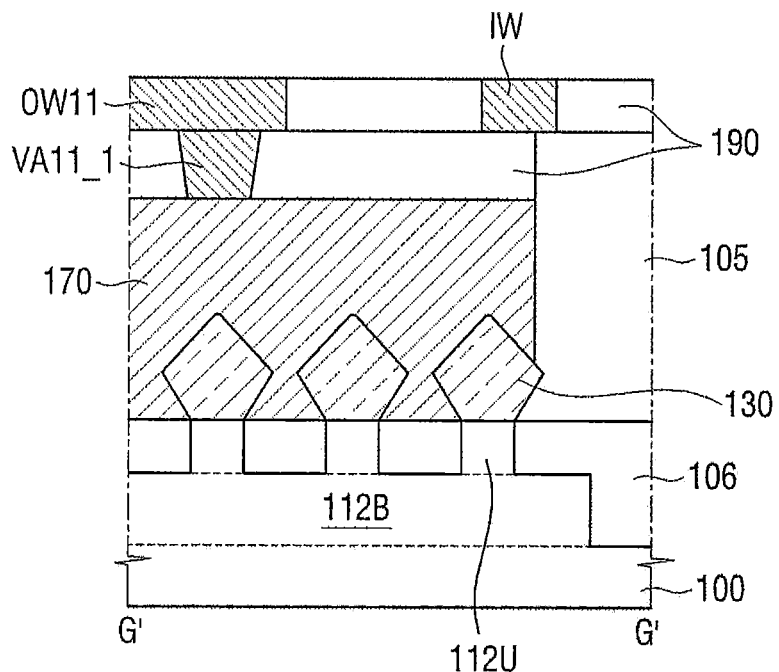
FIG. 11A through 11B are cross-sectional views taken along line G-G' of FIG. 9.

In FIGS. 10A and 11A, the gate via VB1 may be formed on the gate contact 175. The gate via VB1 may connect the gate contact 175 to an input wiring pattern IW. The source/drain vias VA may be formed on the source/drain contacts 170, 170_1, and 170_2. The source/drain vias VA may be at least partially connected to the source/drain contacts 170, 170_1, and 170_2. The source/drain vias VA may include a normal via VA11 (e.g., VA11-1) connecting the normal source/drain contact 170 and an output wiring pattern OW (e.g., OW11) and power wiring vias VA12 and VA13 connecting the extended source/drain contacts 170_1 and 170_2 and the power wirings PWR1 and PWR2.

In FIGS. 10A through 11B, the wiring patterns IW and OW11 and the power wirings PWR1 and PWR2 may extend in the first direction X. The power wirings PWR1 and PWR2 may include the upper power wiring PWR1 to which a first voltage is supplied and the lower power wiring PWR2 to which a second voltage is supplied. The upper power wiring PWR1 may supply power to the p-type transistor, and the lower power wiring PWR2 may supply power to the n-type transistor.

A structure connecting the gate contact 175 to the input wiring pattern IW and structures connecting the source/drain contacts 170, 170_1 and 170_2 to the output wiring pattern OW11 and the power wirings PWR1 and PWR2 may not be the structures illustrated in FIGS. 10A and 11A.

Figure 10B:
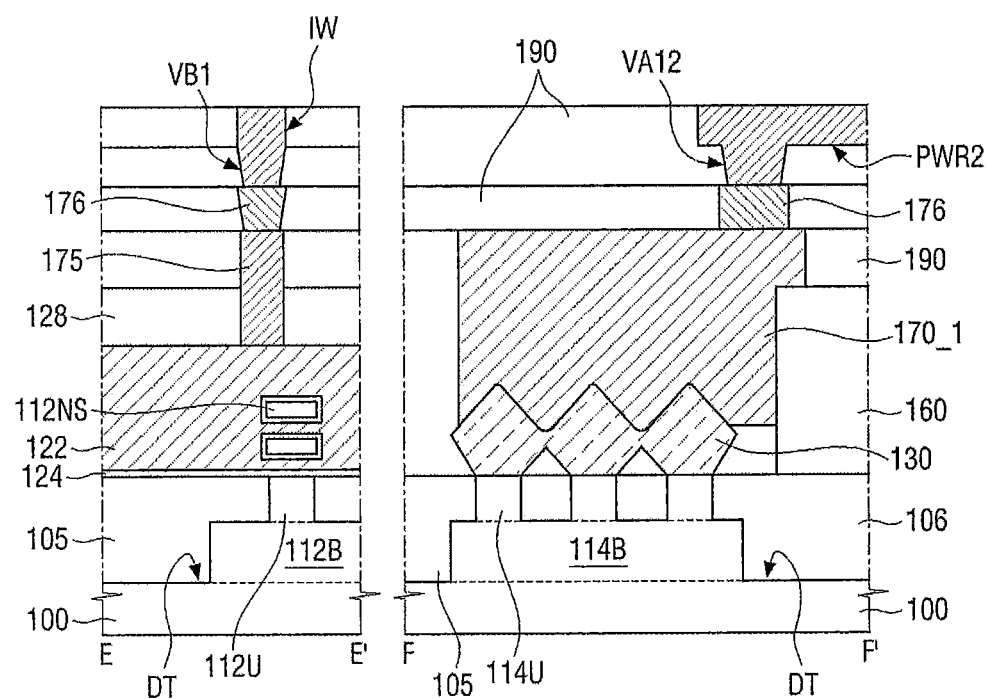
Figure 11B:
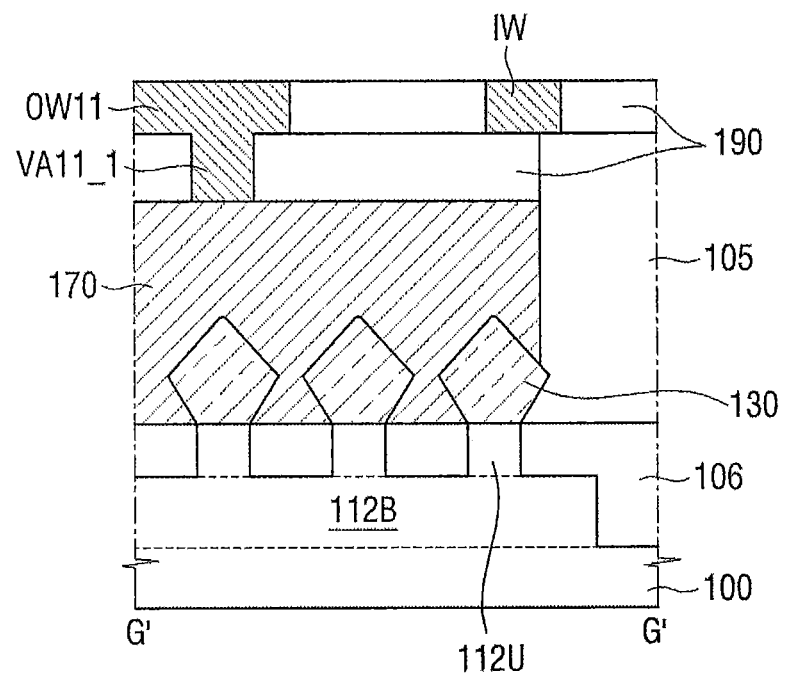

In FIGS. 10B and 11B, a middle contact 176 may be further interposed between the source/drain vias VA and the source/drain contacts 170, 170_1, and 170_2. The middle contact 176 may be further interposed between the gate via VB1 and the gate contact 175. Although the input wiring pattern IW and the gate via VB1 are integrated with each other in the drawings, the present disclosure is not limited thereto. The input wiring pattern IW and the gate via VB1 may also be separated by a barrier layer.

Figure 10C:
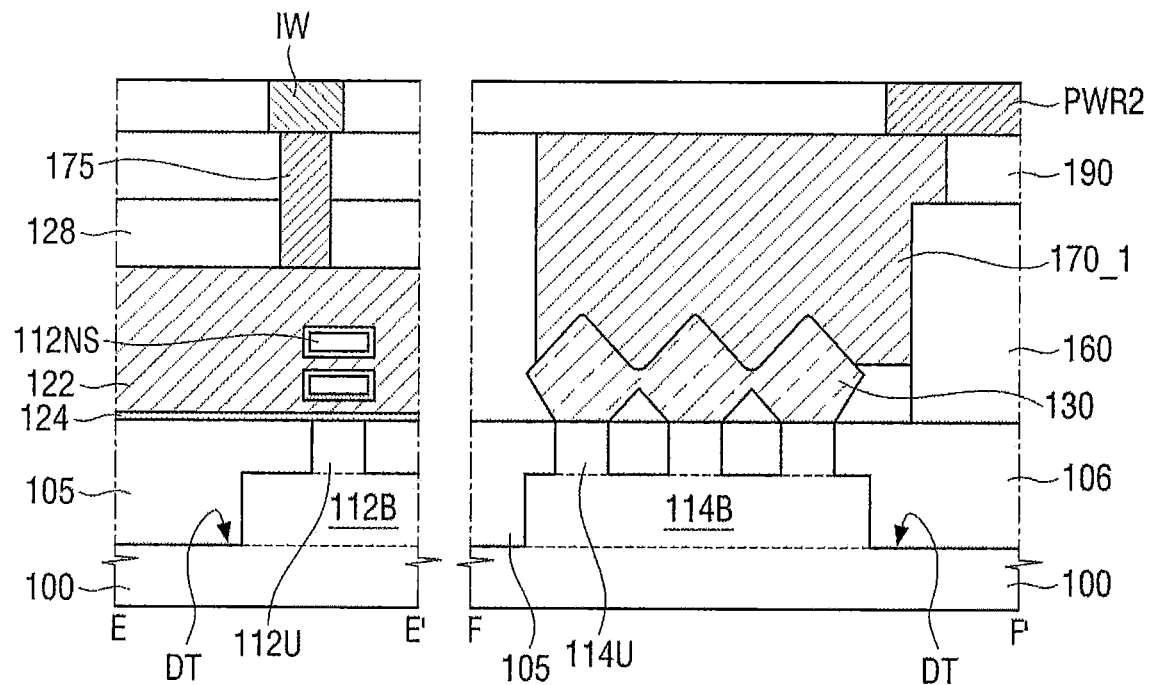

In FIG. 10C, the source/drain contacts 170, 170_1, and 170_2 may be connected to the output wiring pattern OW11 and the power wirings PWR1 and PWR2 without the source/drain vias VA. The gate contact 175 may be connected to the input wiring pattern IW without the gate via VB1.

Figure 12:
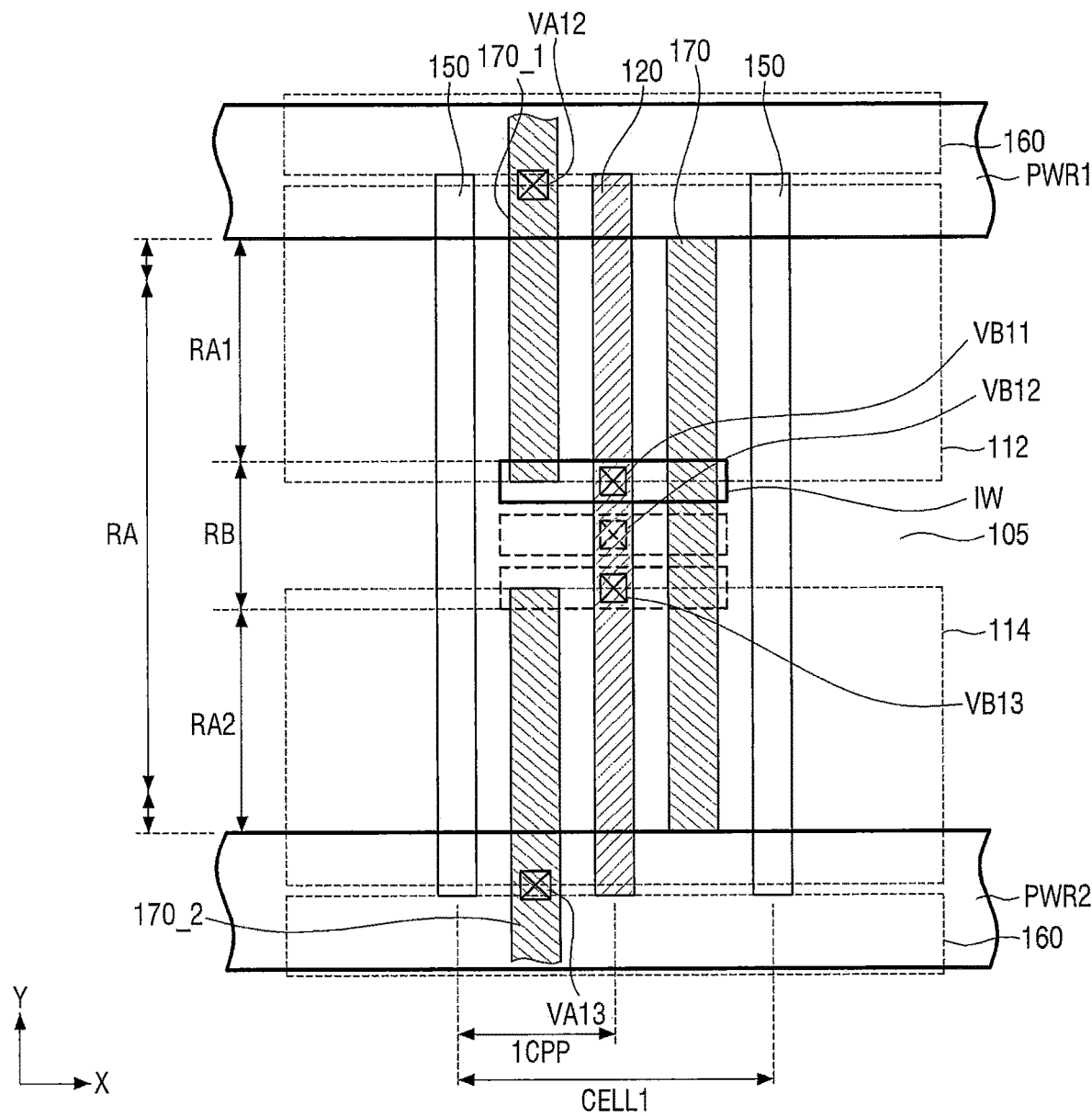
FIG. 12 is a top view of an integrated circuit according to example embodiments.

FIG. 12 is a top view of an integrated circuit according to example embodiments. In the following description and drawings, a redundant description of the same elements and features as those described above using FIGS. 1 through 11B will be given briefly or omitted.

Figure 13:
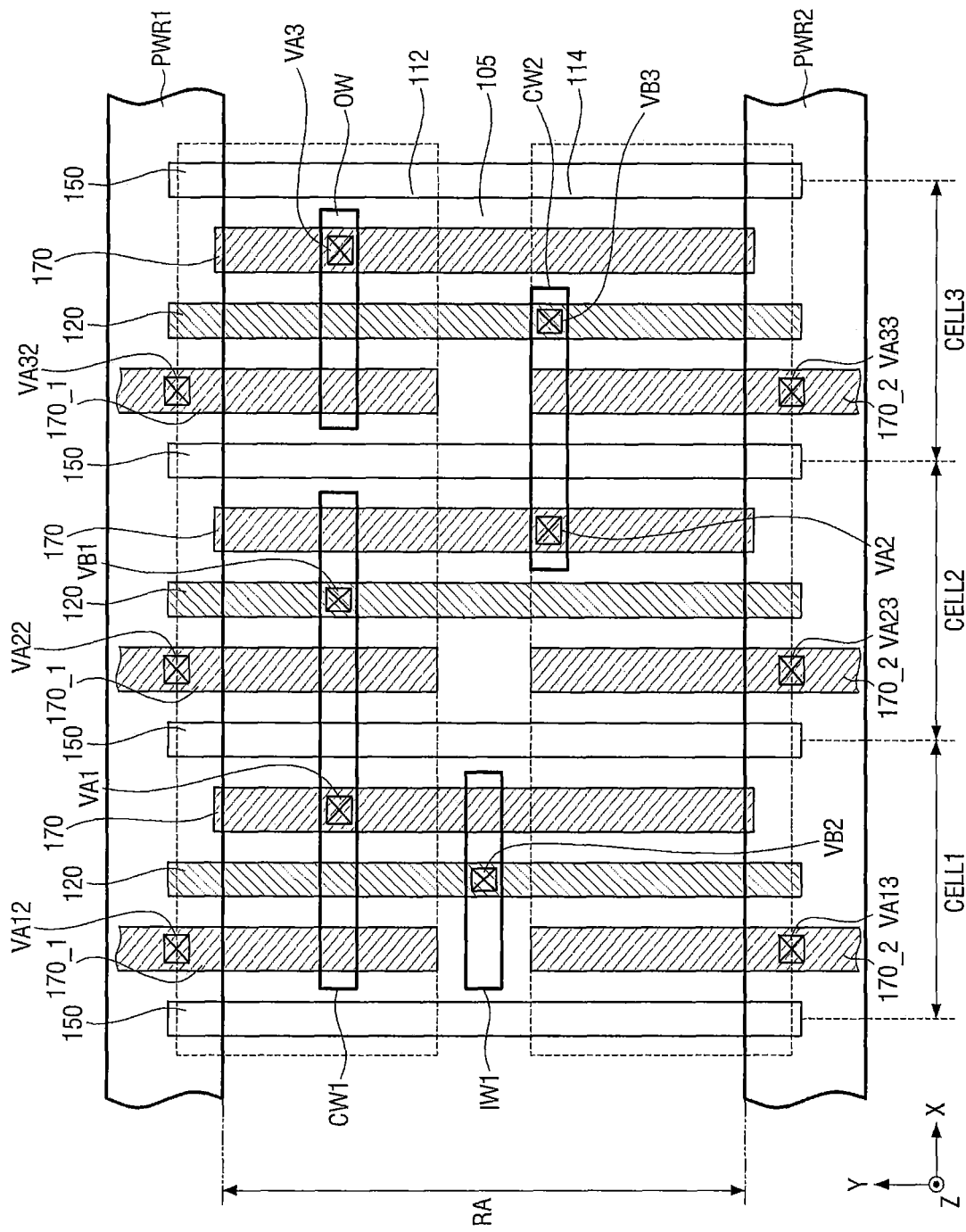
FIG. 13 is a top view of an integrated circuit according to example embodiments.
Figure 14:
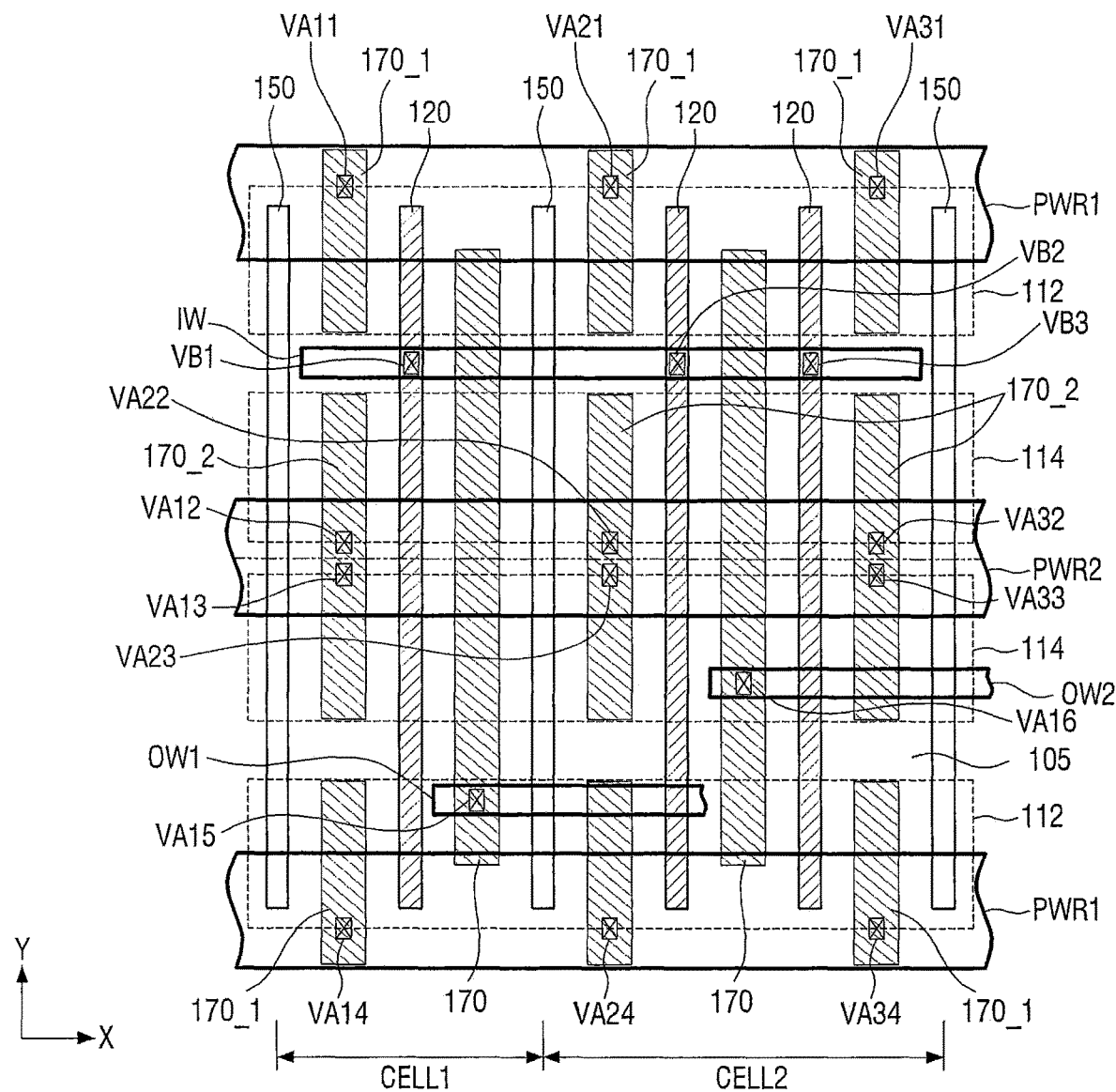
FIG. 14 is a top view of an integrated circuit according to example embodiments.

FIGS. 12 through 14 are top views of integrated circuits according to example embodiments. For ease of description, an input wiring and an output wiring will be referred to as such, but may also be referred to as connection wirings between cells.

Referring to FIG. 12, an input wiring IW may be connected to a gate stack 120 extending in the second direction Y. For example, the input wiring IW may overlap a gate via VB11, VB12, or VB13 in a third direction Z.

At least a part of a gate via may overlap an active region separation layer 105 (RB region). According to embodiments, the gate via VB12 may be disposed on the gate stack 120 intersecting the active region separation layer 105, or the gate via VB11 may be disposed on the gate stack 120 extending over a part of the active region separation layer 105 and a part of a first active region 112. In some embodiments, the gate via VB13 may be disposed on the gate stack 120 extending over a part of the active region separation layer 105 and a part of a second active region 114.

Although not illustrated, a gate via VB may also be disposed on the gate stack 120 in a part of an RA region excluding the RB region (illustrated as regions RA1 and RA2 in FIG. 12). For example, a gate via may be disposed on the gate stack 120 intersecting the first active region 112 extending in the first direction X, or a gate via may be disposed on the gate stack 120 intersecting the second active region 114.

Referring to FIGS. 1 and 12, in a standard cell, an output wiring OW is disposed at the same level as the input wiring IW and extends in the same first direction X as the input wiring IW but does not overlap the input wiring IW. That is, the input wiring IW and the output wiring OW are staggered. For example, when the input wiring IW extends in the first direction X on an upper surface of a part of the active region separation layer 105 and an upper surface of a part of the second active region 114 according to the position of the gate via VB13, the output wiring OW may be disposed on a source/drain via VA overlapping, in the third direction Z, a source/drain contact 170 on an upper surface of the first active region 112 according to embodiments. In some embodiments, the output wiring OW may be disposed on a source/drain via VA overlapping, in the third direction Z, the source/drain contact 170 on the second active region 114 between the input wiring IW and a second power wiring PWR2 according to embodiments.

That is, in one standard cell, a first power wiring PWR1, the second power wiring PWR2, the input wiring IW, and the output wiring OW may be disposed at the same level M1. In the standard cell, the output wiring OW may intersect a part of the normal source/drain contact 170 excluding the normal source/drain contact 170 intersecting the input wiring IW in the second direction Y. That is, in the standard cell, the output wiring OW may not be routed to a wiring pattern at a higher level than the input wiring IW by using the normal source/drain contact 170 as an output terminal, thereby further improving integration density.

Referring to FIG. 13, an integrated circuit may include a first standard cell CELL1, a second standard cell CELL2, and a third standard cell CELL3. According to embodiments, the integrated circuit includes three buffers connected in series. Each of the first through third standard cells CELL1 through CELL3 may include a p-type transistor formed on a first active region 112 and an n-type transistor formed on a second active region 114. Each standard cell may have a width of 2 CPP.

Extended source/drain contacts 170_1 of the first through third standard cells CELL1, CELL2, and CELL3 may be connected to a first power wiring PWR1 through source/drain vias VA12, VA22, and VA32, and extended source/drain contacts 170_2 are connected to a second power wiring PWR2 through source/drain vias VA13, VA23, and VA33.

An input wiring IW1 may be connected to a gate stack 120 on an active region separation layer 105 of the first standard cell CELL1 through a gate via VB2.

A normal source/drain contact 170 of the first standard cell CELL1 may be connected to a first intermediate wiring CW1 extending in the first direction X through a source/drain via VA1. The first intermediate wiring CW1 may be connected to a gate stack 120 of the second standard cell CELL2 through a gate via VB1.

A normal source/drain contact 170 of the second standard cell CELL2 may be connected to a second intermediate wiring CW2 extending in the first direction X through a source/drain via VA2. The second intermediate wiring CW2 may be connected to a gate stack 120 of the third standard cell CELL3 through a gate via VB3.

A normal source/drain contact 170 of the third standard cell CELL3 may be connected to an output wiring OW extending in the first direction X through a source/drain via VA3.

The first power wiring PWR1, the second power wiring PWR2, the input wiring IW, the intermediate wirings CW1 and CW2, and the output wiring OW are all disposed at the same M1 level. However, the input wiring IW1, the intermediate wirings CW1 and CW2, and the output wiring OW are staggered not to overlap each other in one standard cell.

FIG. 14 is a top view of an integrated circuit according to embodiments.

Unlike in the embodiments of FIGS. 1 through 13, a standard cell may be designed to include at least three power wirings and at least four active regions.

The integrated circuit according to the embodiments may include a first standard cell CELL1 having a width of 2 CPP and a second standard cell CELL2 having a width of 3 CPP.

The integrated circuit may include a first power wiring PWR1, a second power wiring PWR2, and a third power wiring PWR1. The two power wirings PWR1 included in FIG. 14 will be referred to as the first power wiring PWR1 (bottom) and the third power wiring PWR1 (top), respectively. According to an embodiment, the same power supply voltage may be applied to the first power wiring PWR1 and the third power wiring PWR1.

The integrated circuit may include a first active region 112 and a second active region 114 between the first power wiring PWR1 and the second power wiring PWR2 extending in the first direction X and spaced apart by a predetermined distance in the second direction Y. The integrated circuit may include a third active region 114 and a fourth active region 112 between the second power wiring PWR2 and the third power wiring PWR1 extending in the first direction X and spaced apart by a predetermined distance in the second direction Y. The two active regions 112 included in FIG. 14 will be referred to as the first active region 112 (bottom) and the fourth active region 112 (top), respectively. The two active regions 114 included in FIG. 14 will be referred to as the second active region 114 (bottom) and the third active region 114 (top), respectively. In some embodiments, the active region separation layer 105 may be respectively between the first active region 112, the second active region 114, the third active region 114, and the fourth active region 112.

The integrated circuit includes insulating gates 150 and gate stacks 120 spaced apart from each other by 1 CPP. The first standard cell CELL1 may include two insulating gates 150 and one gate stack 120. The second standard cell CELL2 may include two insulating gates 150 and two gate stacks 120.

The integrated circuit includes a plurality of source/drain contacts 170, 170_1, and 170_2. The first standard cell CELL1 includes extended source/drain contacts 170_1 and 170_2 between one insulating gate 150 and the gate stack 120. The extended source/drain contacts 170_1 and 170_2 may intersect and be connected to the first power wiring PWR1 (bottom), the second power wiring PWR2 and the third power wiring PWR1 (top) through source/drain vias. VA11 through VA14, respectively. In addition, the first standard cell CELL1 includes a normal source/drain contact 170 between another insulating gate 150 and the gate stack 120. The normal source/drain contact 170 may intersect and be connected to a first output wiring OW1 through a source/drain via VA15.

The two gate stacks 120 included in the second standard cell CELL2 will be referred to as a first gate stack 120 (left) and a second gate stack 120 (right), respectively. The gate stack 120 of the first standard cell CELL1 and the first gate stack 120 and the second gate stack 120 of the second standard cell CELL2 may intersect an input wiring IW and be connected to the input wiring IW through gate vias VB1 through VB3.

The second standard cell CELL2 includes extended source/drain contacts 170_1 and 170_2 between one insulating gate 150 and the first gate stack 120 and extended source/drain contacts 170_1 and 170_2 between the second gate stack 120 and another insulating gate 150. The extended source/drain contacts 170_1 and 170_2 may intersect and be connected to the first power wiring PWR1 (bottom), the second power wiring PWR2, and the third power wiring PWR1 (top) through source/drain vias VA21 through VA24 and VA31 through VA34, respectively.

In addition, the second standard cell CELL2 includes a normal source/drain contact 170 between the first gate stack 120 and the second gate stack 120. The normal source/drain contact 170 may intersect and be connected to a second output wiring OW2 through a source/drain via VA16.

The first output wiring OW1 and the second output wiring OW2 may be spaced apart from the input wiring IW in the second direction Y so as not to overlap the input wiring IW in their respective standard cells. In the illustrated embodiments, the first output wiring OW1 and the second output wiring OW2 are illustrated as separate wiring patterns. However, the first output wiring OW1 and the second output wiring OW2 may also be connected to form the same wiring pattern according to another standard cell arrangement embodiment.

Figure 15:
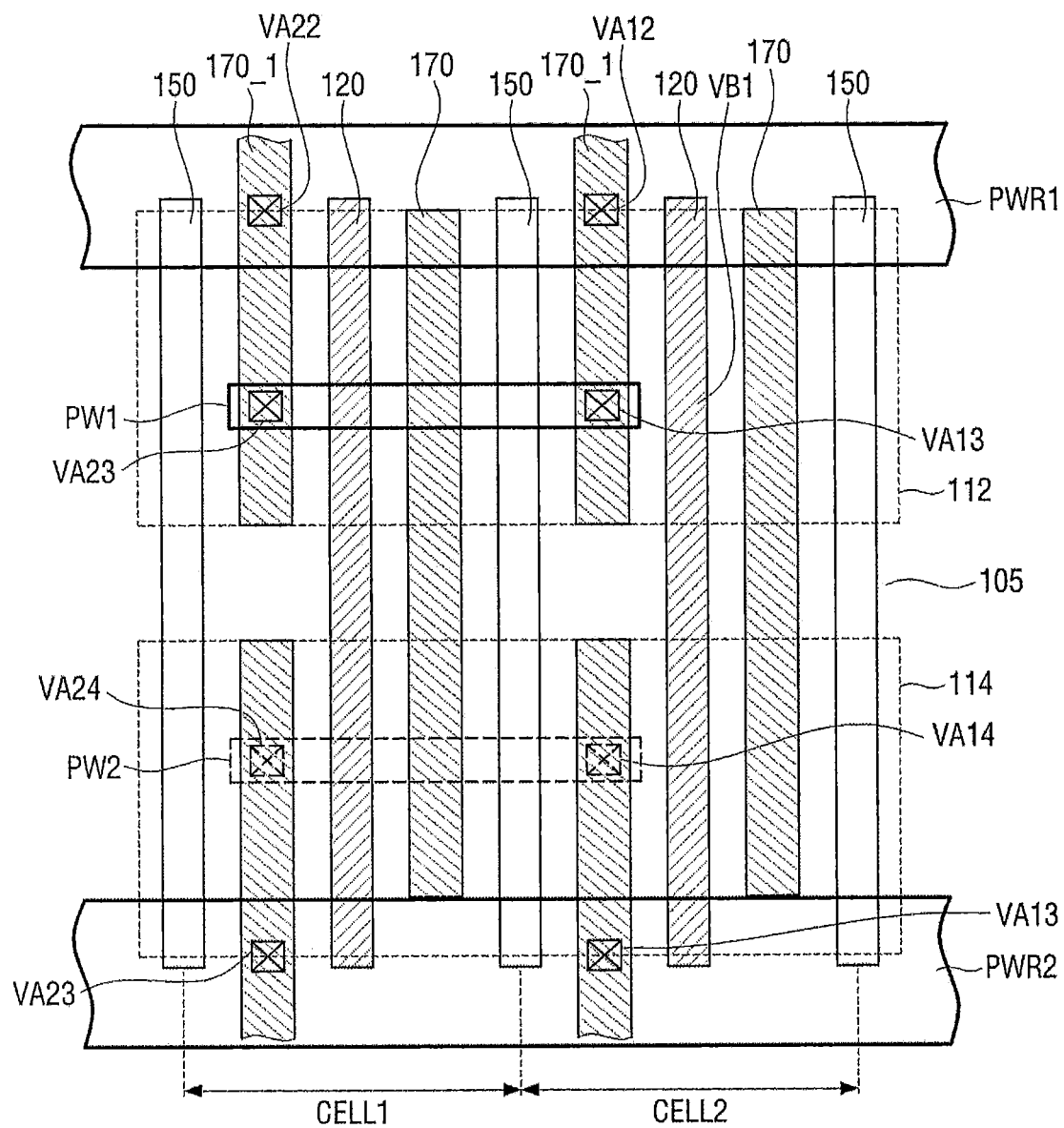
FIG. 15 is a top view of an integrated circuit according to example embodiments.
Figure 16:
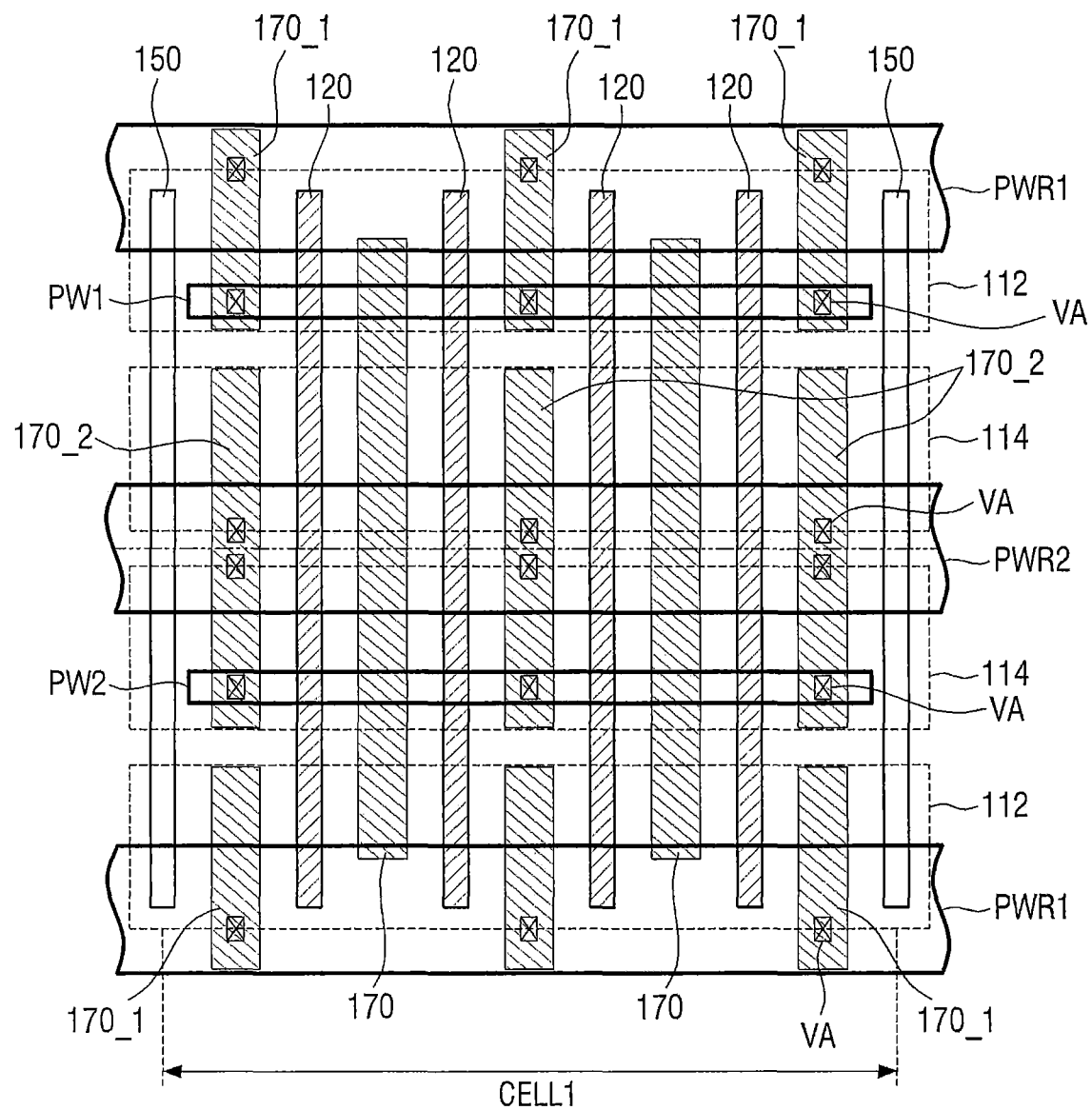
FIG. 16 is a top view of an integrated circuit according to example embodiments.

FIG. 15 is a top view of an integrated circuit according to example embodiments. FIG. 16 is a top view of an integrated circuit according to example embodiments. The embodiments of FIG. 15 show a single-height standard cell disposed between two power wirings, and the embodiments of FIG. 16 show a multi-height standard cell disposed between three or more power wirings.

Referring to FIG. 15, the integrated circuit may include an additional power wiring to stabilize power supplied to each standard cell. That is, because a plurality of standard cells are disposed, a power wiring may be additionally disposed to supplement power supply.

For example, a standard cell having a width of 4 CPP may include a first additional power wiring PW1. The same first power supply voltage may be applied to the first additional power wiring PW1 and a first power wiring PWR1. The first additional power wiring PW1 may intersect first extended source/drain contacts 170_1 and be connected to the first extended source/drain contacts 170_1 through source/drain vias VA23 and VA13.

According to an embodiment, the standard cell may also include a second additional power wiring PW2. The same second power supply voltage may be applied to the second additional power wiring PW2 and a second power wiring PWR2. The second additional power wiring PW2 may intersect second extended source/drain contacts 170_2 and be connected to the second extended source/drain contacts 170_2 through source/drain vias VA24 and VA14.

Referring to FIG. 16, the integrated circuit may include a first additional power wiring PW1 or a second additional power wiring PW2. Unlike in FIG. 15, in FIG. 16, the first additional power wiring PW1 may be disposed between a third power wiring PWR1 (top) and a second power wiring PWR2, and the second additional power wiring PW2 may be disposed between the second power wiring PWR2 and a first power wiring PWR1 (bottom).

Figure 17:
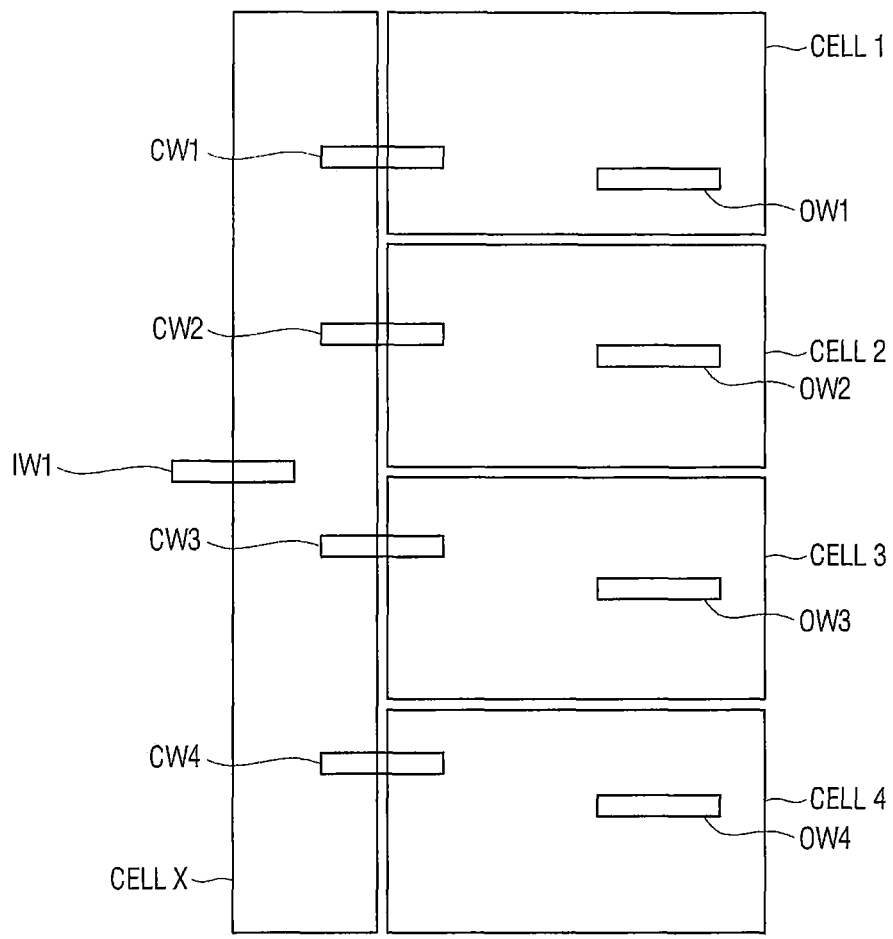
FIG. 17 is a top view of an integrated circuit according to example embodiments.

FIG. 17 is a top view of an integrated circuit according to example embodiments.

In FIG. 17, the integrated circuit may include first through fourth single-height standard cells CELL1 through CELL 4 branching from a multi-height standard cell CELL X and connected to the multi-height standard cell CELL X. According to various embodiments, the multi-height standard cell CELL X may be any one standard cell set in a standard cell library or may be a filler cell. According to various embodiments, the first through fourth standard cells CELL1 through CELL 4 may be identical or different standard cells or may be complementary standard cells. In some embodiments, CELL X and/or CELL1 through CELL 4 may be configured using example cell structures described herein.

In the illustrated embodiments, the multi-height standard cell CELL X may be connected to the first through fourth single-height standard cells CELL1 through CELL 4. The multi-height standard cell CELL X may include two insulating gates 150 and at least one normal source/drain contact 170 extending in the second direction Y between an uppermost power wiring and a lowermost power wiring. The multi-height standard cell CELL X may include extended source/drain contacts 170_1 and 170_2 extending in the second direction Y between a plurality of power wirings and spaced apart by a predetermined distance.

When the multi-height standard cell CELL X is a standard cell, it may further include at least one gate stack 120 between the insulating gates 150 spaced apart in the first direction X. In this case, an input wiring IW1 may intersect and be connected to the gate stack 120. Branching intermediate wirings CW1 through CW4 may intersect the normal source/drain contact 170 and may be used as input wirings of the adjacent single-height standard cells CELL1 through CELL 4.

When the multi-height standard cell CELL X is a filler cell, it may include two or more insulating gates 150 and a filler source/drain contact. The filler source/drain contact may be a normal source/drain contact 170. In this case, the input wiring IW1 may intersect and be connected to the filler source/drain contact 170. The branching intermediate wirings CW1 through CW4 may intersect the filler source/drain contact 170 and may be used as the input wirings of the adjacent single-height standard cells CELL1 through CELL 4.

The intermediate wirings CW1 through CW4 extending from the multi-height standard cell CELL X may intersect and be connected to the gate stacks 120 of the single-height standard cells CELL1 through CELL 4 through gate vias VB, respectively. At least one normal source/drain contact 170 of each of the single-height standard cells CELL1 through CELL 4 may be connected to an output wiring OW1, OW2, OW3 or OW4 extending in the first direction X through a source/drain via VA.

A power wiring, an input wiring, an intermediate wiring, and an output wiring between a standard cell and a standard cell may be disposed at the same level M1, thereby improving placement and routing (PnR) density.

Figure 18:
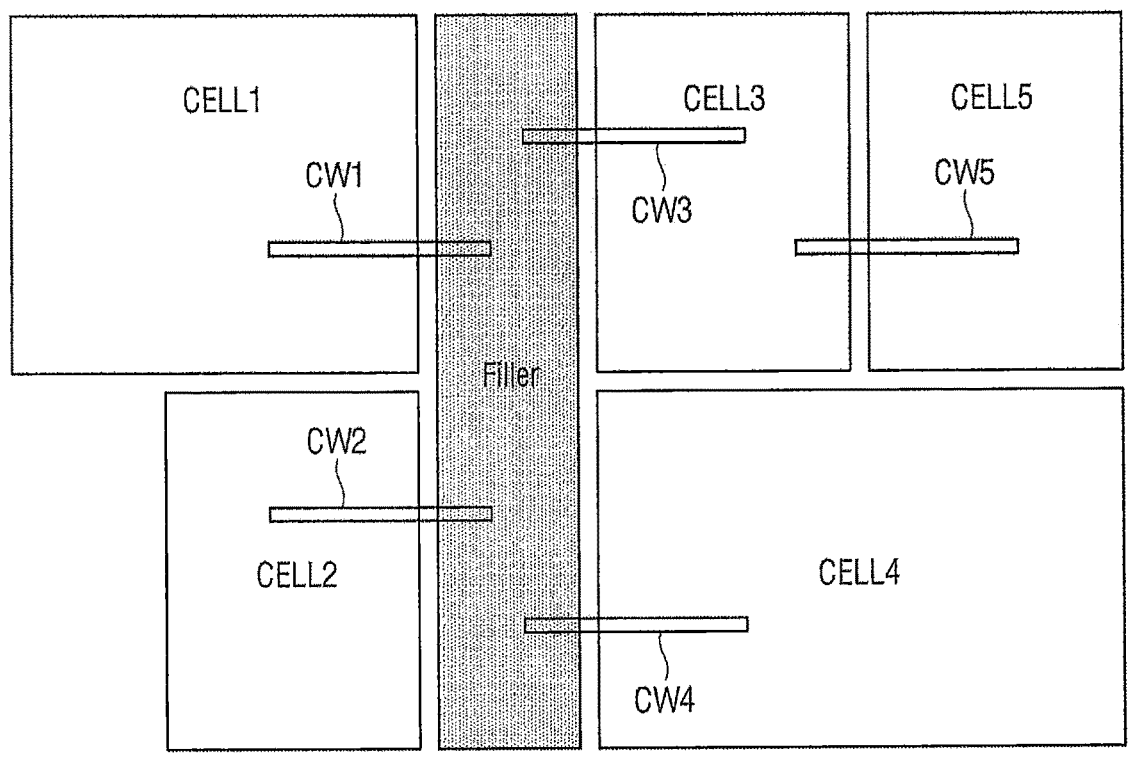
FIG. 18 is a top view of an integrated circuit according to example embodiments.

FIG. 18 is a top view of an integrated circuit according to example embodiments.

Referring to FIG. 18, the integrated circuit may include a plurality of standard cells and a filler cell. In the illustrated embodiments, four single-height standard cells (CELL1 through CELL 5) and one multi-height filler cell are illustrated. However, various layout arrangements of standard cells are possible according to embodiments.

The filler cell may be disposed between adjacent standard cells when input and output wirings in each standard cell are complicated. An input wiring, an intermediate wiring, and an output wiring are all wiring patterns extending in the first direction X and should be placed not to overlap each other in the first direction X within one standard cell. For example, when an output signal of a standard cell CELL1 needs to be received by a plurality of standard cells CELL 2 through CELL 4, a filler cell may be used. In some embodiments, the filler cell and/or CELL1 through CELL 5 may be configured using example cell structures described herein.

In the above example, the standard cell CELL1 may transmit an output signal to the adjacent standard cells CELL 2 through CELL 4 by using a normal source/drain contact 170 of the filler cell as an output terminal. Specifically, an output wiring CW1 of the standard cell CELL1 may be connected to the normal source/drain contact 170 of the filler cell through a source/drain via VA, and input wirings CW2 through CW4 of the adjacent standard cells CELL 2 through CELL 4 may be connected to the normal source/ drain contact 170 of the filler cell through source/drain vias VA.

Figure 19:
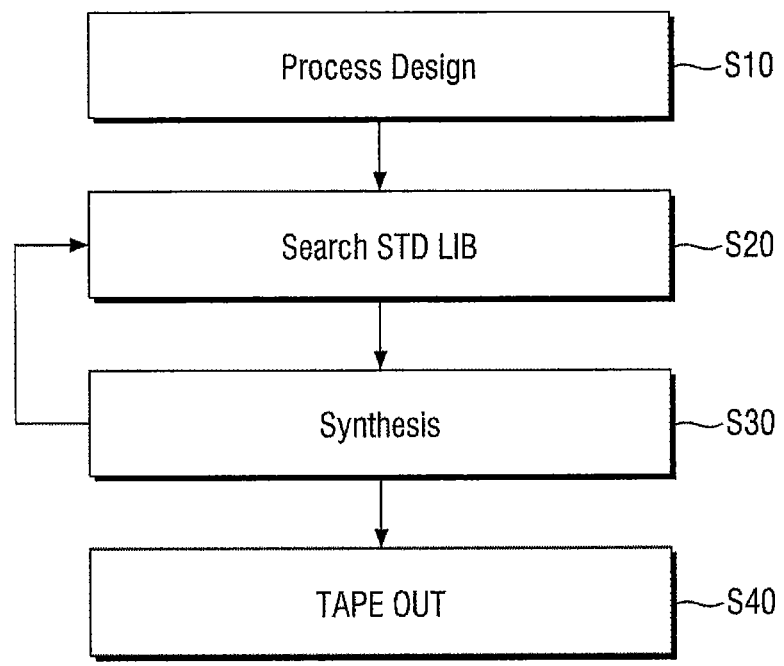
FIG. 19 is a flowchart illustrating a method of designing an integrated circuit using standard cells according to example embodiments.

FIG. 19 is a flowchart illustrating a method of designing an integrated circuit using standard cells according to example embodiments.

Referring to FIG. 19, first, a process design for an integrated circuit required by a user is set (operation S10). When the process design is set, standard cells required for the set process design are selected from a pre-stored standard cell library (operation S20) and combined according to the process (operation S30). The standard cell library may store layouts of a plurality of standard cells and information about the standard cells. The information about the standard cells may include functions, characteristics, and requirements of the standard cells.

When the standard cells are combined, they may be selected from the standard cell library in consideration of placement according to an operation sequence, the routing relationship between input/output wirings for transmitting signals, operation timing, etc.

The finally selected standard cells may be taped out to a final layout of the integrated circuit by combining all of operation timing, signal wirings, etc. (operation S40).

While example embodiments have been shown and described above, it will be apparent to those skilled in the art that modifications and variations could be made without departing from the scope of the present disclosure as defined by the appended claims.

What is claimed is:

1. An integrated circuit comprising:
    a first standard cell comprising:
        a first p-type transistor;
        a first n-type transistor;
        a first gate stack that extends in a second direction to intersect a first active region and a second active region that extends in a first direction;
        at least two first extended source/drain contacts that extend in the second direction on a first side of the first gate stack;
        a first normal source/drain contact that extends in the second direction on a second side of the first gate stack that is opposite the first side;
        a first gate via that is connected to the first gate stack; and
        a first source/drain via that is connected to the first normal source/drain contact;
    a second standard cell that is adjacent the first standard cell in the first direction and comprises:
        a second p-type transistor;
        a second n-type transistor;
        a second gate stack that extends in the second direction to intersect the first active region and the second active region; and
        a second gate via that is connected to the second gate stack;
    an input wiring of the first standard cell that extends in the first direction and is connected to the first gate via; and
    an output wiring of the first standard cell that extends in the first direction and is at a same level as the input wiring to have a direct electrical connection between the first source/drain via and the second gate via,
    wherein the first p-type transistor and the second p-type transistor are on the first active region,
    wherein the first n-type transistor and the second n-type transistor are on the second active region.

2. The integrated circuit of claim 1, wherein the first standard cell further comprises:
    a third gate stack that extends in the second direction to intersect the first active region and the second active region and is spaced apart from the first gate stack;
    a third extended source/drain contact that extends in the second direction on a first side of the third gate stack; and
    a third gate via that is connected to the third gate stack,
    wherein the first normal source/drain contact extends in the second direction between the second side of the first gate stack and a second side of the third gate stack that is opposite the first side of the third gate stack, and
    wherein the input wiring of the first standard cell is connected to the first gate via and the third gate via.

3. The integrated circuit of claim 1, wherein the second standard cell further comprises:
    a second normal source/drain contact that extends in the second direction to intersect the first active region and the second active region and is on a side of the second gate via; and
    a second source/drain via that is connected to the second normal source/drain contact.

4. The integrated circuit of claim 1, wherein the first standard cell further comprises:
    at least two third source/drain vias that extend in the first direction and overlap the at least two first extended source/drain contacts in a third direction, respectively; and a first power wiring and a second power wiring that overlap the third source/drain vias in the third direction, are connected to the third source/drain vias, and extend in the first direction.

5. The integrated circuit of claim 4, wherein in the first standard cell, the first power wiring, the second power wiring, the input wiring, and the output wiring are at the same level in the third direction, and
wherein the output wiring is not connected to a wiring pattern at a higher level than the same level.

6. The integrated circuit of claim 1, wherein the first active region and the second active region comprise nanosheets, and the first gate stack and the second gate stack surround the nanosheets.

7. The integrated circuit of claim 1, further comprising:
a filler cell that is between the first standard cell and the second standard cell in the first direction, wherein the filler cell comprises:
a first insulating gate that extends in the second direction to form a boundary with the first standard cell;
a second insulating gate that extends in the second direction to form a boundary with the second standard cell;
a filler source/drain contact that extends in the second direction between the first insulating gate and the second insulating gate; and
at least one filler source/drain via that is connected to the filler source/drain contact and connected to a second connection wiring.

8. The integrated circuit of claim 7, further comprising:
at least one third standard cell that is adjacent to the filler cell in the first direction and adjacent to the first standard cell in the second direction,
wherein a length of the filler cell in the second direction is a sum of lengths of the first standard cell and the third standard cell in the second direction, and
wherein the third standard cell comprises a third gate stack that extends in the second direction and a third gate via that is connected to the third gate stack and connected to the second connection wiring.

9. The integrated circuit of claim 8, further comprising:
a cell separation layer that extends in the first direction and is between the first standard cell and the third standard cell.

10. The integrated circuit of claim 1, wherein the first standard cell further comprises a third p-type transistor and a third n-type transistor,
wherein the third p-type transistor is on a third active region extending in the first direction and the third n-type transistor is on a fourth active region extending in the first direction,
wherein the first gate stack extends in the second direction to intersect the first through fourth active regions, and
wherein the first normal source/drain contact extends in the second direction to intersect the first through fourth active regions.

11. An integrated circuit comprising a plurality of standard cells that are adjacent to each other and a first connection wiring, wherein each of the standard cells comprises:
at least two active regions that extend in a first direction;
an active region separation layer that extends in the first direction and is between the at least two active regions;
a gate stack that extends in a second direction to intersect the at least two active regions and the active region separation layer;
a gate via that is stacked on the gate stack in a third direction and is connected to the gate stack;
an extended source/drain contact that extends in the second direction on a first side of the gate stack;
a normal source/drain contact that extends in the second direction on a second side of the gate stack opposite the first side;
a plurality of extended source/drain vias that are stacked on the extended source/drain contact in the third direction and are connected to the extended source/drain contact; and
a normal source/drain via that is stacked on the normal source/drain contact in the third direction and is connected to the normal source/drain contact,
wherein the normal source/drain contact comprises an output terminal of each standard cell, and
wherein the first connection wiring extends in the first direction and directly connects the normal source/drain via of a first standard cell and the gate via of a second adjacent standard cell.

12. The integrated circuit of claim 11, wherein each of the standard cells further comprises at least two power wirings on the active region separation layer, and
wherein the power wirings and the first connection wiring are at a same level in the third direction.

13. The integrated circuit of claim 11, further comprising a filler cell that is between at least two of the plurality of standard cells,
wherein the filler cell comprises:
a filler source/drain contact that extends in the second direction between insulating gates at both sides of the at least two standard cells and is spaced apart from the insulating gates in the first direction; and
first and second filler source/drain vias that are stacked on the filler source/drain contact and connected to the filler source/drain contact, and
wherein the first connection wiring is connected to the first filler source/drain via, and the second filler source/drain via is connected to a second connection wiring and connected to the gate via of one of the at least two adjacent standard cells.

14. An integrated circuit comprising:
a first standard cell comprising:
a first p-type transistor;
a first n-type transistor;
a first gate stack that extends in a second direction to intersect a first active region and a second active region that extends in a first direction;
a first source/drain contact that extends in the second direction on the first active region and on a first side of the first gate stack;
a second source/drain contact that extends in the second direction on the second active region and on the first side of the first gate stack;
a third source/drain contact extending in the second direction on the first and second active regions and a second side of the first gate stack that is opposite the first side;
a first gate via that is electrically connected to the first gate stack; and
a first source/drain via that is electrically connected to the third source/drain contact;
a second standard cell that is adjacent the first standard cell in the first direction and comprises:
a second p-type transistor;
a second n-type transistor;
a second gate stack that extends in the second direction to intersect the first active region and the second active region; and a second gate via that is electrically connected to the second gate stack;

an input wiring of the first standard cell that extends in the first direction and is electrically connected to the first gate via; and an intermediate wiring that extends in the first direction, is at a same level as the input wiring, and comprises a direct electrical connection between the first source/drain via and the second gate via, wherein the intermediate wiring is not connected to a wiring pattern at a higher level than the same level, wherein the first p-type transistor and the second p-type transistor are on the first active region, and wherein the first n-type transistor and the second n-type transistor are on the second active region.

15. The integrated circuit of claim 14, wherein the first standard cell further comprises:

a third gate stack that extends in the second direction to intersect the first active region and the second active region and is spaced apart from the first gate stack;

a fourth source/drain contact extending in the second direction on either the first active region or the second active region and on a first side of the third gate stack; and a third gate via that is electrically connected to the third gate stack, wherein the third source/drain contact extends in the second direction between the second side of the first gate stack and a second side of the third gate stack that is opposite the first side of the third gate stack, and wherein the input wiring of the first standard cell is electrically connected to the first gate via and the third gate via.

16. The integrated circuit of claim 14, wherein the second standard cell further comprises:

a fifth source/drain contact that extends in the second direction to intersect the first active region and the second active region and is on a side of the second gate via; and a second source/drain via that is electrically connected to the fifth source/drain contact.

17. The integrated circuit of claim 14, wherein an active region separation layer extending in the first direction between the first active region and the second active region, wherein the input wiring is on the active region separation layer.

18. The integrated circuit of claim 14, wherein the first standard cell further comprises:

at least two third source/drain vias that extend in the first direction and overlap the first and second source/drain contacts in a third direction, respectively; and a first power wiring and a second power wiring that overlap the third source/drain vias in the third direction, are electrically connected to the third source/drain vias, and extend in the first direction.

19. The integrated circuit of claim 18, wherein in the first standard cell, the first power wiring, the second power wiring, the input wiring, and the intermediate wiring are at the same level in the third direction.

20. The integrated circuit of claim 14, wherein the first standard cell further comprises a third p-type transistor and a third n-type transistor, wherein the third p-type transistor is on a third active region extending in the first direction and the third n-type transistor is on a fourth active region extending in the first direction, wherein the first gate stack extends in the second direction to intersect the first through fourth active regions, and wherein the third source/drain contact extends in the second direction to intersect the first through fourth active regions.

\* \* \* \* \*